United States Patent
Yamamoto

(10) Patent No.: US 11,195,690 B2
(45) Date of Patent: Dec. 7, 2021

(54) CHARGED PARTICLE BEAM DEVICE

(71) Applicant: Hitachi High-Tech Corporation, Tokyo (JP)

(72) Inventor: Takuma Yamamoto, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 0 days.

(21) Appl. No.: 16/851,749

(22) Filed: Apr. 17, 2020

(65) Prior Publication Data

US 2020/0365365 A1   Nov. 19, 2020

(30) Foreign Application Priority Data

May 13, 2019   (JP) .............................. JP2019-090347

(51) Int. Cl.
   *H01J 37/22*   (2006.01)
   *H01J 37/244*   (2006.01)
   *H01J 37/28*   (2006.01)

(52) U.S. Cl.
   CPC .......... *H01J 37/222* (2013.01); *H01J 37/244* (2013.01); *H01J 37/28* (2013.01);
   (Continued)

(58) Field of Classification Search
   CPC ........ H01J 37/222; H01J 37/244; H01J 37/28; H01J 2237/24475; H01J 2237/221;
   (Continued)

(56) References Cited

U.S. PATENT DOCUMENTS

| 7,242,015 B2 * | 7/2007 | Shinada | ............... G01N 23/225 |
| | | | 250/492.22 |
| 2004/0040930 A1 * | 3/2004 | Tanaka | .................... H01L 22/10 |
| | | | 216/61 |

(Continued)

FOREIGN PATENT DOCUMENTS

| JP | 2000-266706 A | 9/2000 |
| JP | 2010-85138 A | 4/2010 |

(Continued)

OTHER PUBLICATIONS

Korean-language Office Action issued in Korean Application No. 10-2020-0029955 dated Aug. 6, 2021 (six (6) pages).

(Continued)

*Primary Examiner* — David A Vanore
(74) *Attorney, Agent, or Firm* — Crowell & Moring LLP

(57) ABSTRACT

Even when the amount of overlay deviation between patterns located in different layers is large, correct measurement of the amount of overlay deviation is stably performed. The charged particle beam device includes a charged particle beam irradiation unit that irradiates a sample with a charged particle beam, a first detection unit that detects secondary electrons from the sample, a second detection unit that detects backscattered electrons from the sample, and an image processing unit that generates a first image including an image of a first pattern located on the surface of the sample based on an output of the first detection unit, and generates a second image including an image of a second pattern located in a lower layer than the surface of the sample based on an output of the second detection unit. A control unit adjusts the position of a measurement area in the first image based on a first template image for the first image, and adjusts the position of a measurement area in the second (Continued)

image based on a second template image for the second image.

9 Claims, 24 Drawing Sheets

(52) U.S. Cl.
CPC . *H01J 2237/221* (2013.01); *H01J 2237/2448* (2013.01); *H01J 2237/24475* (2013.01)

(58) Field of Classification Search
CPC ....... H01J 2237/2448; H01J 2237/2826; H01J 2237/24578; H01J 2237/24495; H01J 2237/2801; H01J 2237/2817; G03F 7/70633; H01L 22/12
USPC .................................. 250/306, 310
See application file for complete search history.

(56) References Cited

U.S. PATENT DOCUMENTS

| | | | |
|---|---|---|---|
| 2006/0288325 A1* | 12/2006 | Miyamoto | G03F 7/70625 |
| | | | 716/50 |
| 2008/0230697 A1* | 9/2008 | Tanimoto | G01N 23/225 |
| | | | 250/310 |
| 2011/0139982 A1 | 6/2011 | Kijima et al. | |
| 2012/0274757 A1 | 11/2012 | Bai et al. | |
| 2012/0305767 A1 | 12/2012 | Toyoda et al. | |
| 2013/0234019 A1* | 9/2013 | Miyamoto | G03F 9/7003 |
| | | | 250/306 |
| 2015/0287569 A1 | 10/2015 | Yamamoto et al. | |
| 2016/0056014 A1 | 2/2016 | Yamamoto et al. | |
| 2017/0047197 A1 | 2/2017 | Hotta et al. | |
| 2017/0176358 A1* | 6/2017 | Yeh | G01R 31/307 |
| 2017/0221672 A1* | 8/2017 | Kuroda | H01J 37/147 |
| 2017/0322021 A1 | 11/2017 | Takagi et al. | |
| 2017/0345613 A1* | 11/2017 | Mizuhara | H01J 37/05 |
| 2019/0228522 A1* | 7/2019 | Shinoda | G06N 3/08 |
| 2020/0365365 A1* | 11/2020 | Yamamoto | G03F 7/70633 |
| 2021/0055098 A1* | 2/2021 | Yamaki | G03F 7/70633 |

FOREIGN PATENT DOCUMENTS

| | | |
|---|---|---|
| JP | 2014-86393 A | 5/2014 |
| KR | 10-2015-0054973 A | 5/2015 |
| KR | 10-1849962 B1 | 4/2018 |
| TW | 201428232 A | 7/2014 |
| TW | 201541071 A | 11/2015 |
| WO | WO 2011/068011 A1 | 6/2011 |
| WO | WO 2014/181577 A1 | 11/2014 |

OTHER PUBLICATIONS

Taiwanese-language Office Action issued in Taiwanese Application No. 109115687 dated Aug. 16, 2021 (four (4) pages).

* cited by examiner

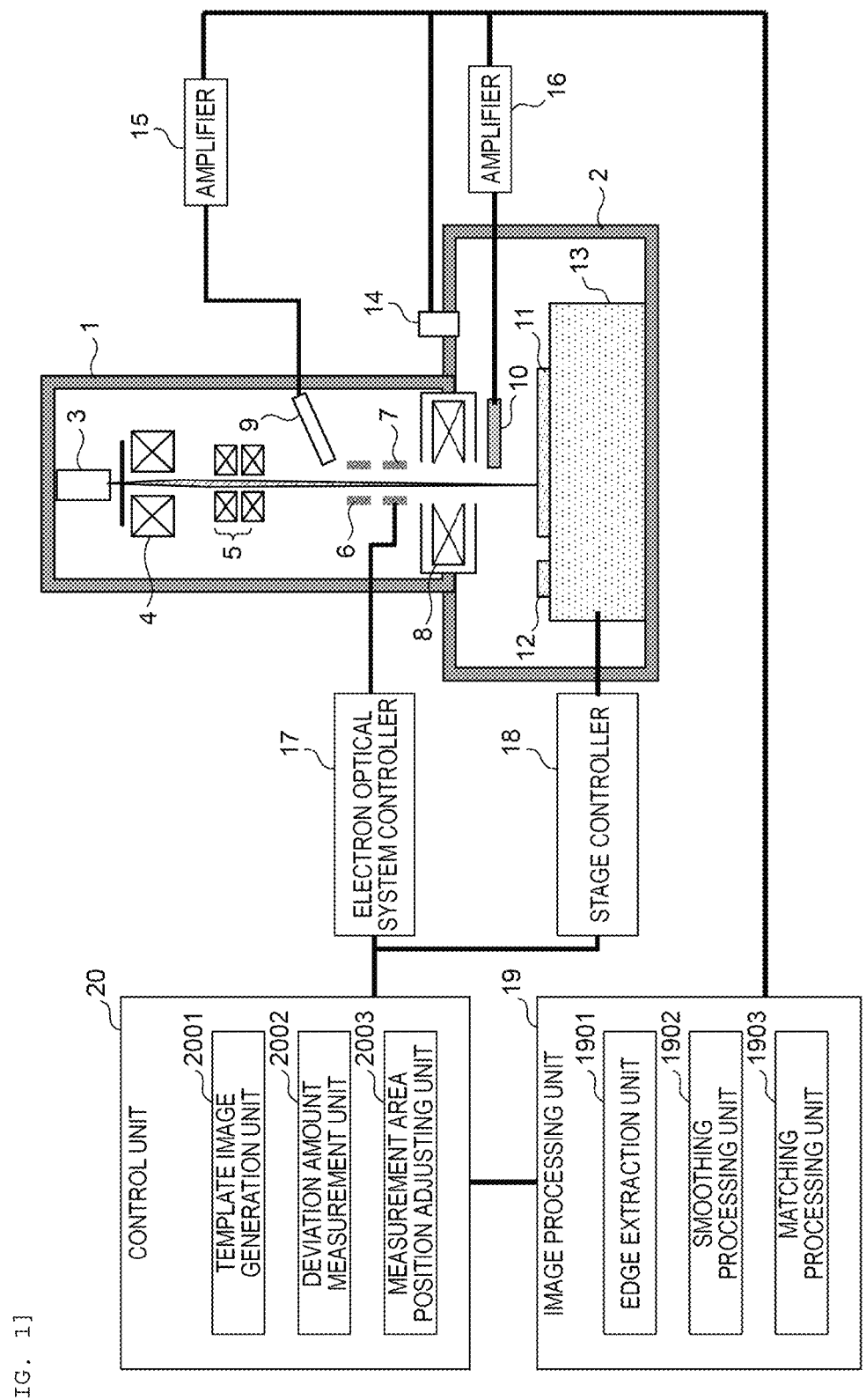
[FIG. 1]

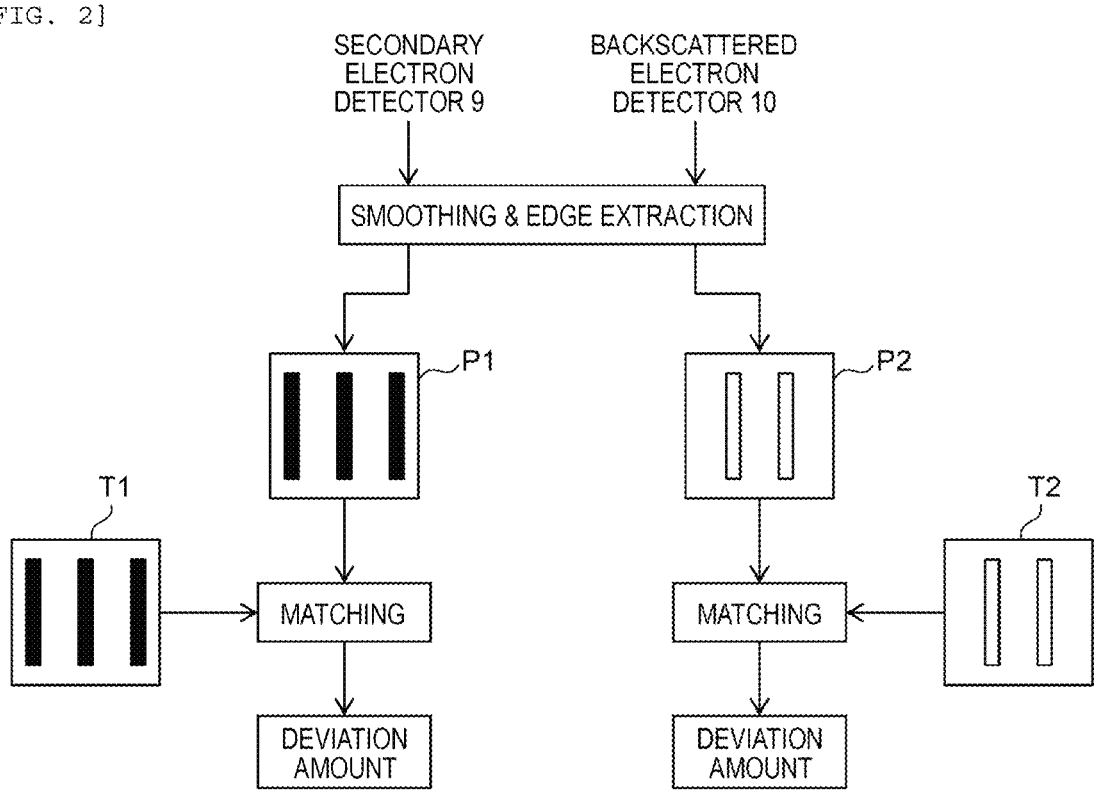

[FIG. 3]
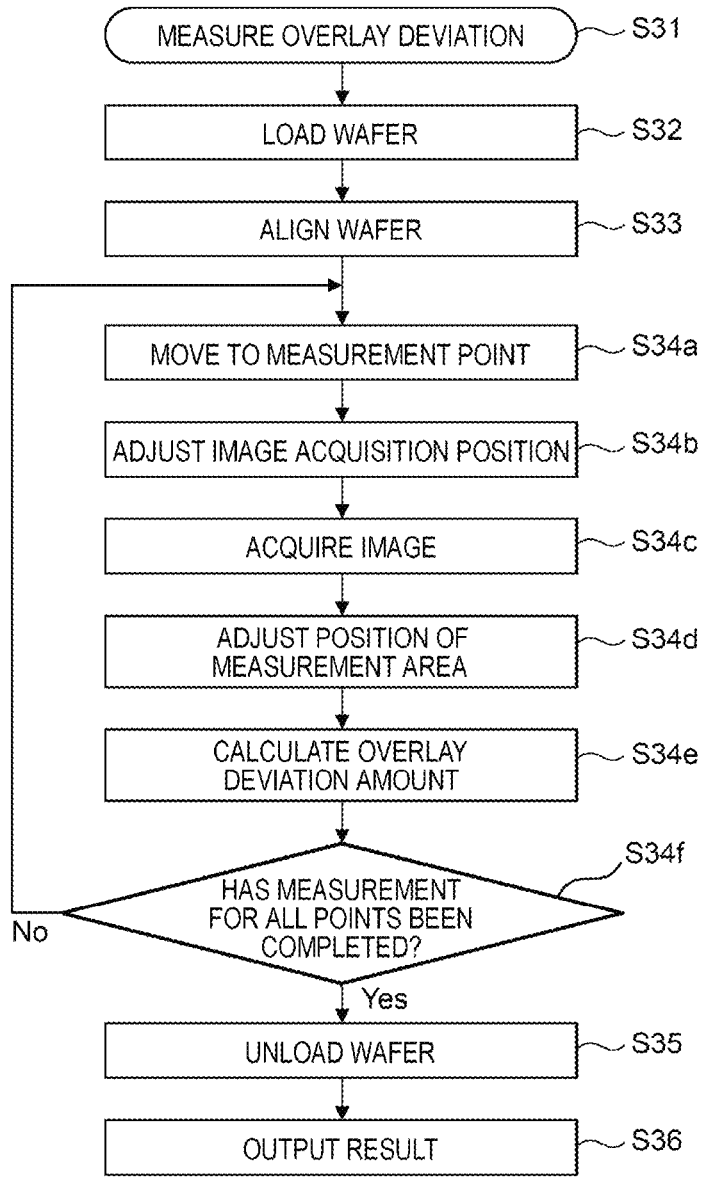

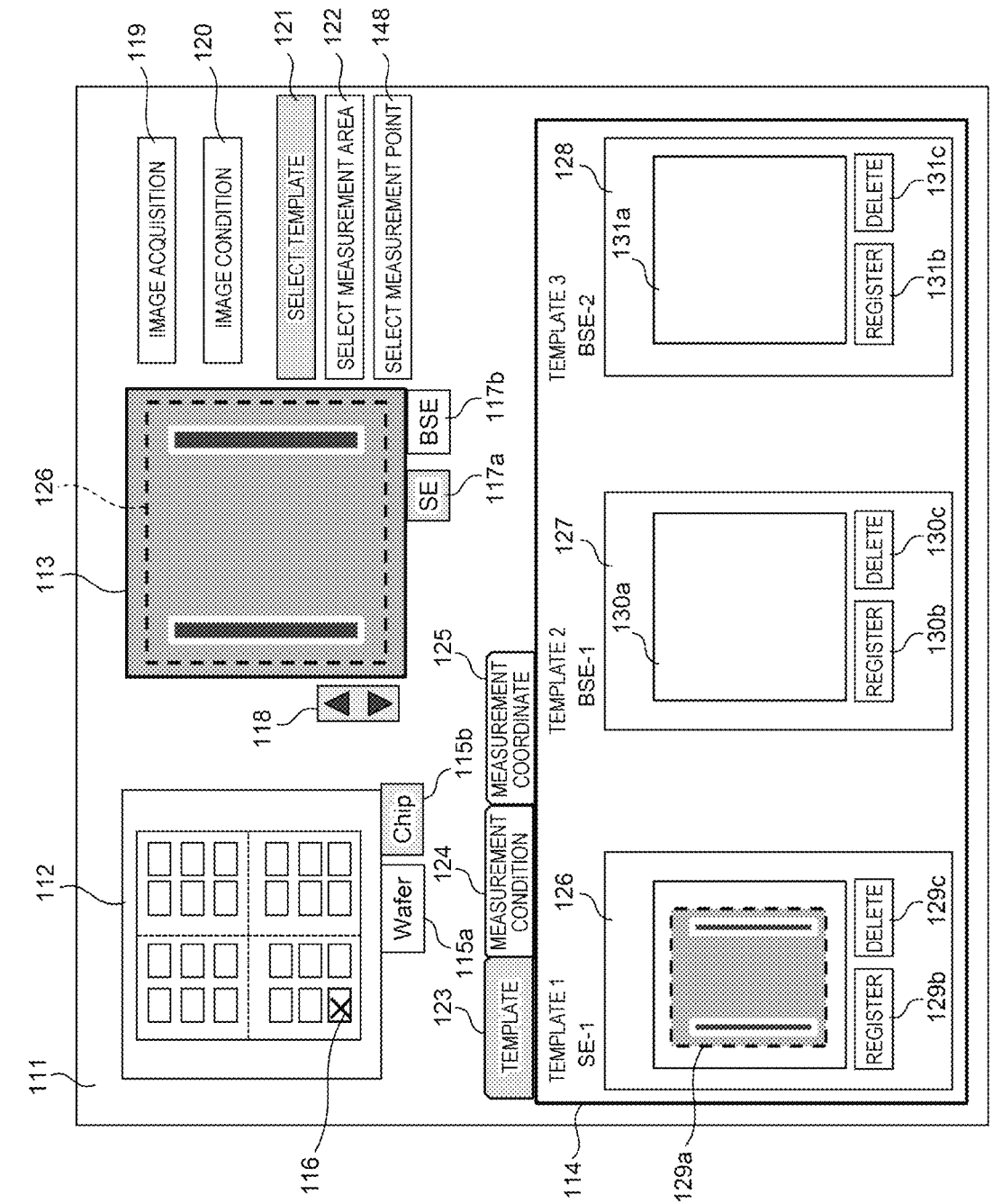

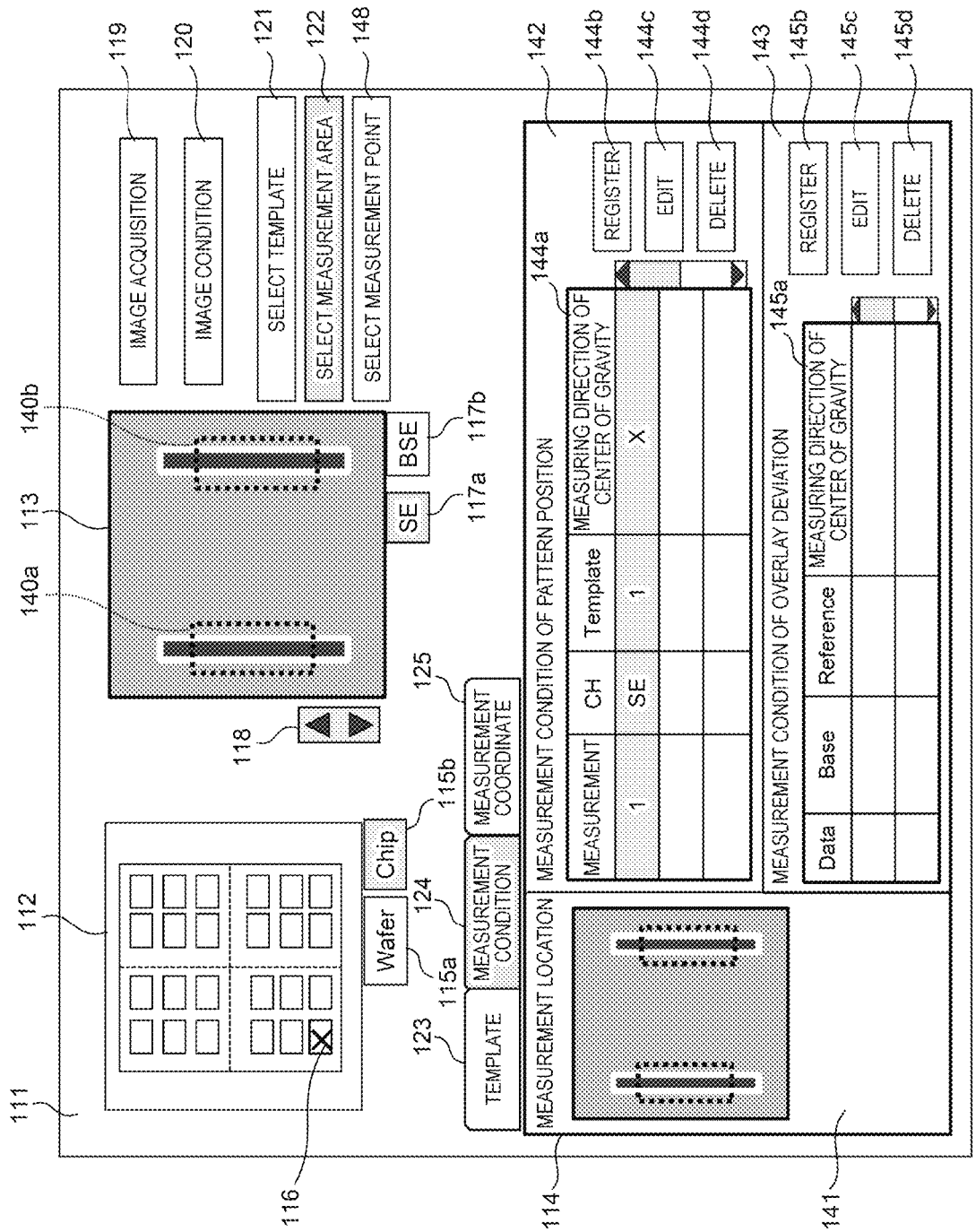

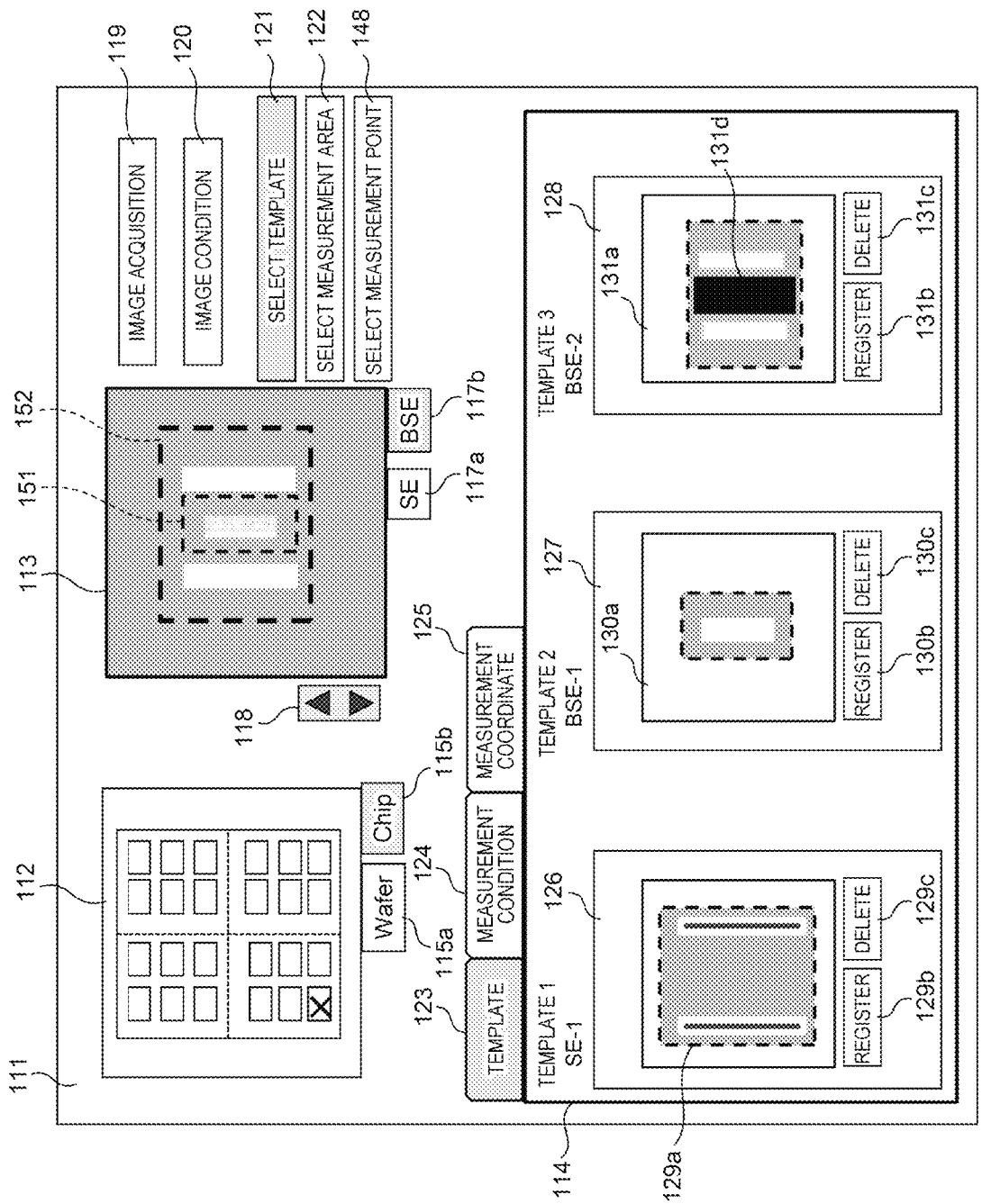
[FIG. 13]

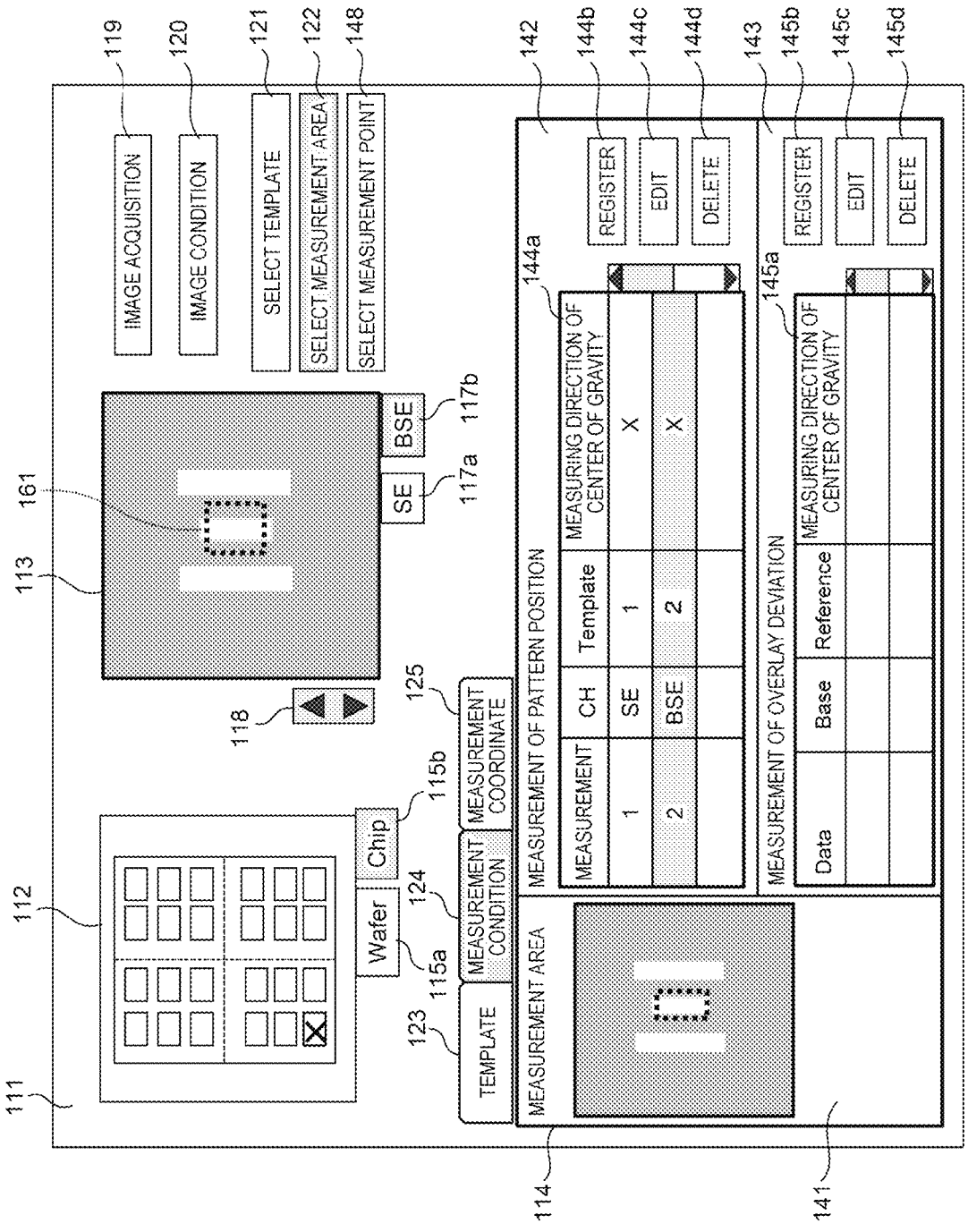

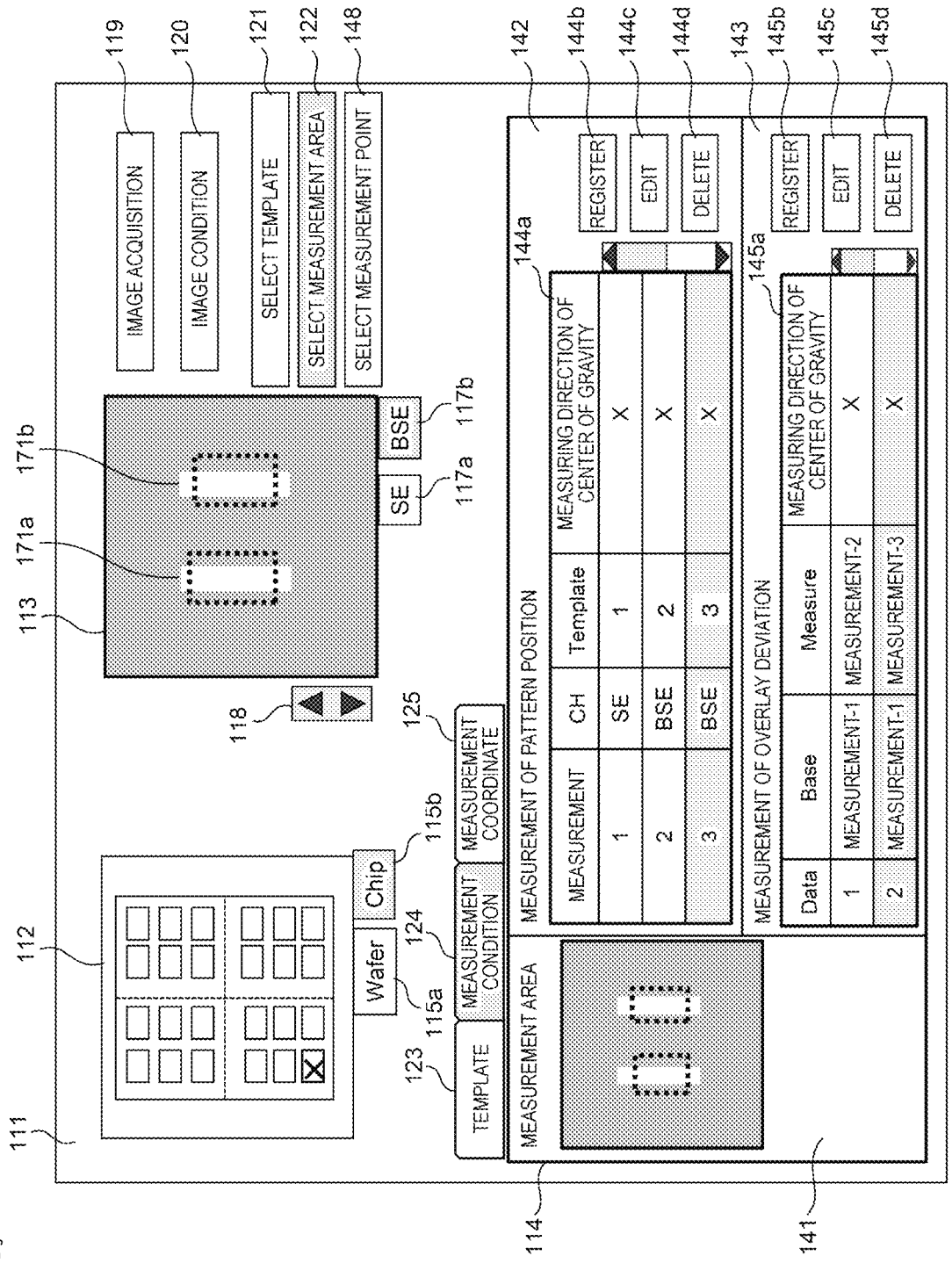

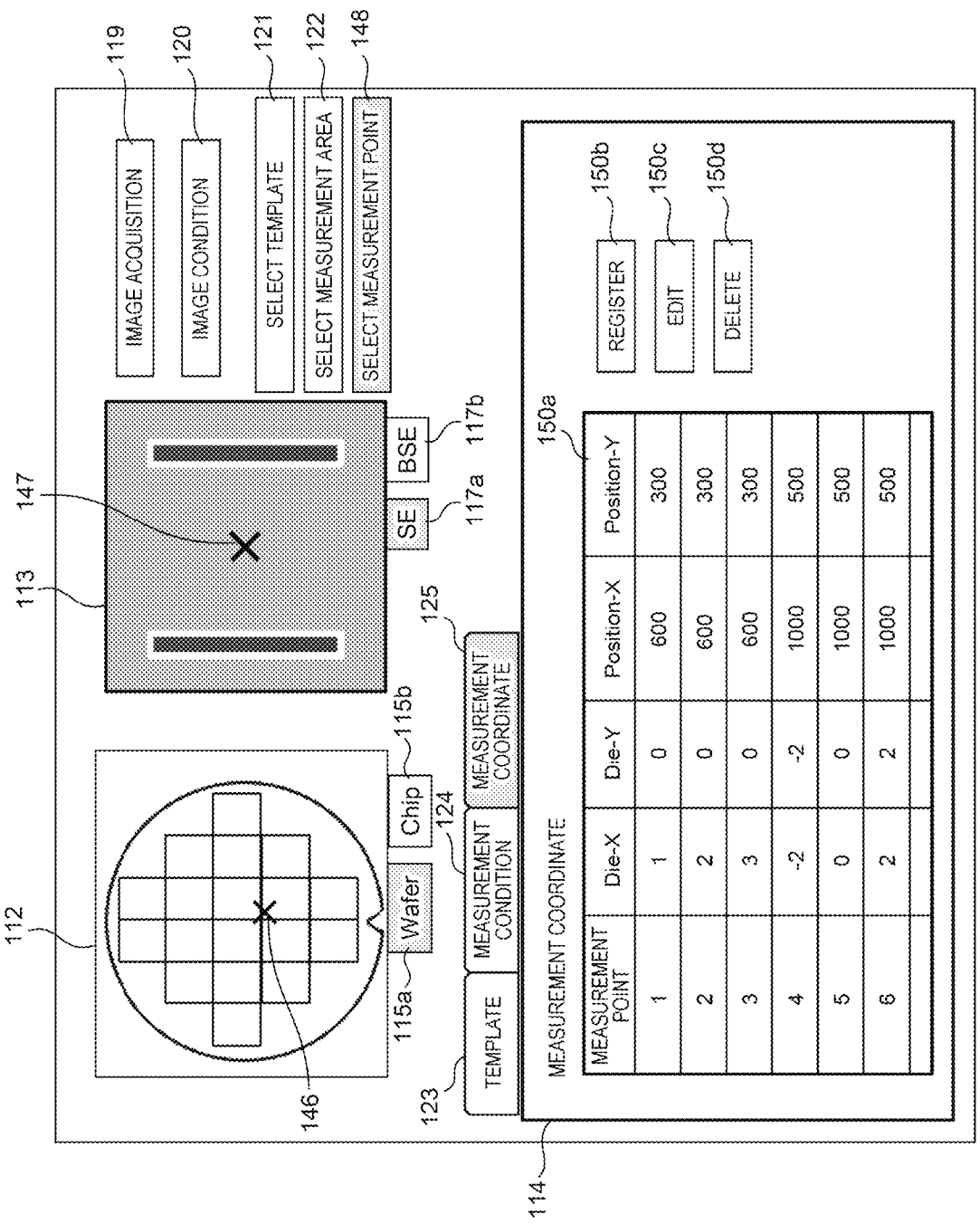
[FIG. 16]

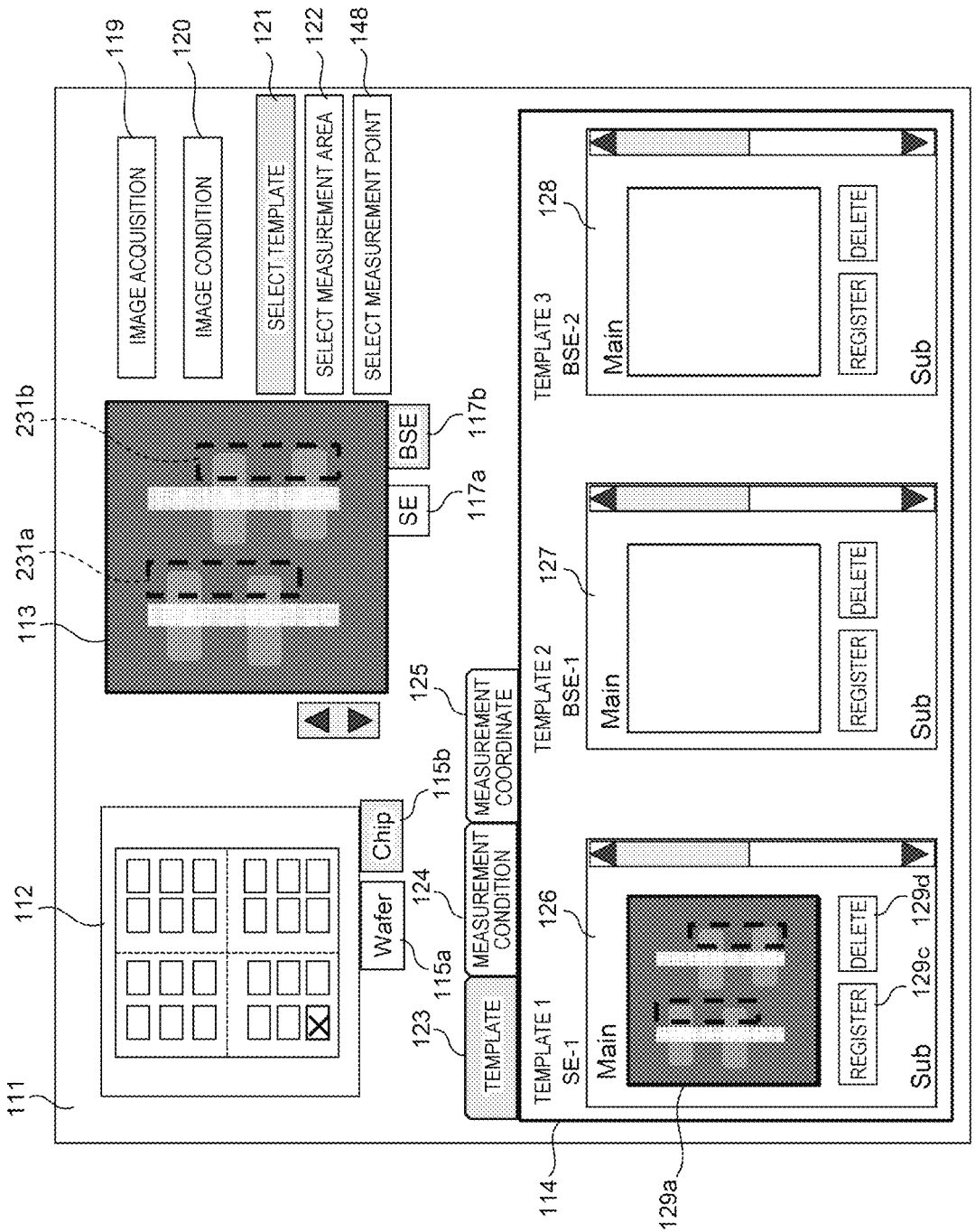
[FIG. 21]

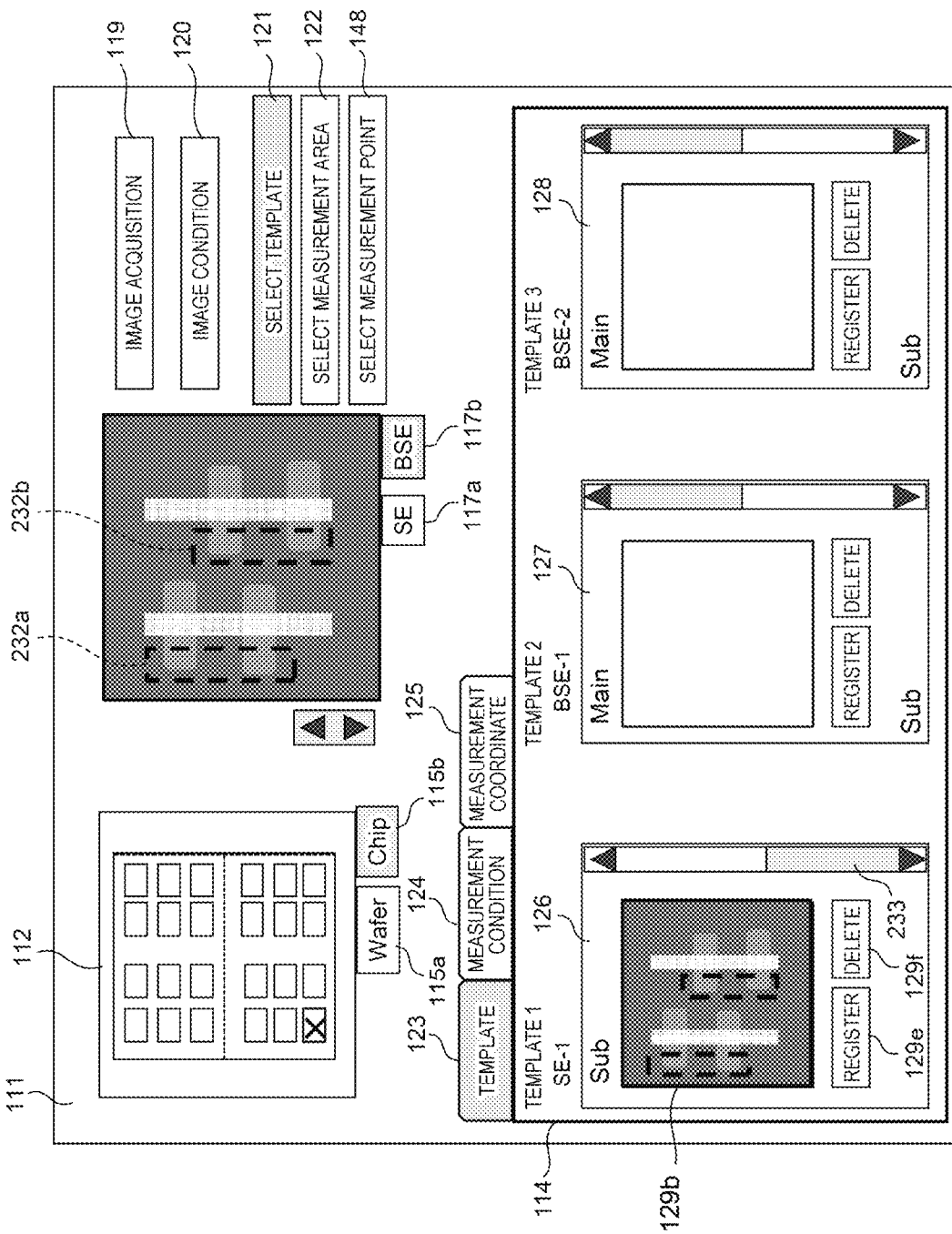
[FIG. 22]

CHARGED PARTICLE BEAM DEVICE

TECHNICAL FIELD

The present invention relates to a charged particle beam device.

BACKGROUND ART

A semiconductor device is manufactured by performing a process of transferring a pattern formed on a photomask onto a semiconductor wafer by using a lithography process and an etching process, and repeating the process. In the manufacturing process of a semiconductor device, the quality of the lithography process and the etching process, the occurrence of foreign matter, and the like greatly affect the yield of manufactured semiconductor devices. Therefore, it is important to detect the occurrence of abnormality or defect in the manufacturing process at an early stage or in advance. For this reason, in the manufacturing process of a semiconductor device, measurement and inspection of a pattern formed on a semiconductor wafer are performed. In particular, with the recent progress of miniaturization and the three-dimensionalization of semiconductor devices in recent years, it has become increasingly important to accurately manage the superposition of patterns between different processes.

In the conventional device, the position of a pattern created in each process has been measured based on reflected light obtained by irradiating a semiconductor device with light, and the amount of overlay deviation of the patterns between different processes has been measured. However, with the progress of miniaturization of patterns, it is difficult to obtain required detection accuracy by a method for detecting a deviation amount with light. Therefore, there is an increasing need to measure the amount of overlay deviation of the patterns using a scanning electron microscope having a higher resolution than light.

For example, PTL 1 proposes a method for measuring a deviation amount between two patterns formed by double patterning using a scanning electron microscope. In PTL 1, two patterns formed on the surface of a semiconductor device become measurement targets. Therefore, the scanning electron microscope can easily obtain those images.

Further, the scanning electron microscope disclosed in PTL 2 detects a signal generated from a pattern formed on a surface in an irradiation region with a secondary electron detector and detects a signal generated from a pattern on a lower layer in the irradiation region with a backscattered electron detector. Based on two signals detected at the same time, the amount of overlay deviation between the surface pattern and the lower layer pattern is measured. In general, secondary electrons contain more information on the sample surface, and backscattered electrons contain more information on the inside the lower layer than that on the sample surface.

However, when the amount of overlay deviation between the surface pattern and the lower layer pattern is measured using the device disclosed in PTL 2, the following problem occurs. That is, in the device of PTL 2, the pattern measurement positions in both images are determined based on either the pattern position of the surface pattern in the secondary electron image or the pattern position of the lower layer pattern in the backscattered electron image. In this case, if the positional deviation between the surface pattern and the lower layer pattern is large, the pattern that is not used for pattern alignment may not be able to be measured normally due to a deviation in the measurement position. Further, when the surface pattern and the lower layer pattern are repetitive patterns, there is a concern that a measurement value shifted by the repetition period may be calculated if the overlay deviation between the surface pattern and the lower layer pattern becomes large.

CITATION LIST

Patent Literature

PTL 1: JP-A-2010-85138
PTL 2: JP-A-2014-86393

SUMMARY OF INVENTION

Technical Problem

The present invention has been made in consideration of the above technical problems, and an object thereof is to provide a charged particle beam device that can stably perform correct measurement of the amount of overlay deviation even when the amount of overlay deviation between patterns located in different layers is large.

Solution to Problem

The charged particle beam device of the present invention includes a charged particle beam irradiation unit that irradiates a sample with a charged particle beam, a first detection unit that detects secondary electrons from the sample, a second detection unit that detects backscattered electrons from the sample, and an image processing unit that generates a first image including an image of a first pattern located on the surface of the sample based on an output of the first detection unit, and generates a second image including an image of a second pattern located in a lower layer than the surface of the sample based on an output of the second detection unit. A control unit adjusts the position of a measurement area in the first image based on a first template image for the first image, and adjusts the position of a measurement area in the second image based on a second template image for the second image.

Advantageous Effects of Invention

According to the present invention, it is possible to provide a charged particle beam device that can perform stable and correct measurement even when the amount of overlay deviation between patterns located in different layers is large.

BRIEF DESCRIPTION OF DRAWINGS

FIG. 1 is a schematic diagram showing a schematic configuration of a scanning electron microscope (SEM) as a charged particle beam device according to a first embodiment.

FIG. 2 is a schematic diagram schematically showing the operation of an image processing unit 19.

FIG. 3 is a flowchart illustrating a procedure of overlay measurement of a wafer (sample) in the scanning electron microscope according to the first embodiment.

FIG. 11 illustrates an example of a graphical user interface (GUI) screen 111 of a scanning electron microscope (SEM) according to the second embodiment.

FIG. 12 illustrates an example of the graphical user interface (GUI) screen 111 of the scanning electron microscope (SEM) according to the second embodiment.

FIG. 13 illustrates an example of the graphical user interface (GUI) screen 111 of the scanning electron microscope (SEM) according to the second embodiment.

FIG. 14 illustrates an example of the graphical user interface (GUI) screen 111 of the scanning electron microscope (SEM) according to the second embodiment.

FIG. 15 illustrates an example of the graphical user interface (GUI) screen 111 of the scanning electron microscope (SEM) according to the second embodiment.

FIG. 16 illustrates an example of the graphical user interface (GUI) screen 111 of the scanning electron microscope (SEM) according to the second embodiment.

FIG. 21 is an example of the GUI screen 111 for registering a template image in the device according to the third embodiment.

FIG. 22 is an example of the GUI screen 111 for registering a template image in the device according to the third embodiment.

DESCRIPTION OF EMBODIMENTS

Figure 4A:
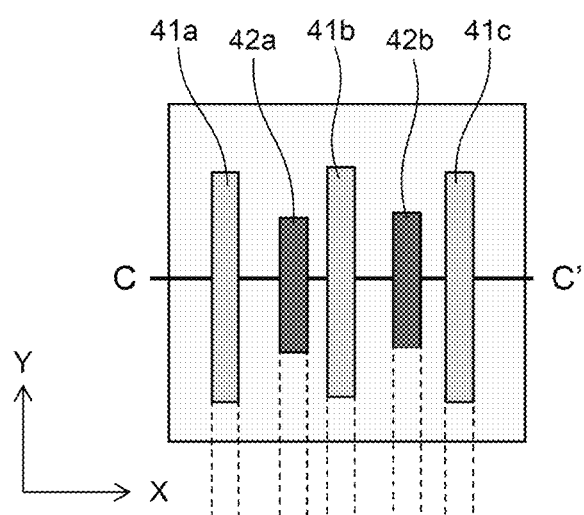
FIGS. 4A and 4B are schematic diagrams showing a configuration example of a wafer 11 as a sample.

Hereinafter, the present embodiment will be described with reference to the accompanying drawings. In the accompanying drawings, functionally the same elements may be represented by the same numbers. Although the accompanying drawings show embodiments and implementation examples in accordance with the principles of the present disclosure, they are for the understanding of the present disclosure, and are not intended to be used for interpreting the present disclosure in a limited manner. The description in this specification is merely exemplary, and is not intended to limit the scope of the claims or the application of the present disclosure in any way.

Although the present embodiment is described in sufficient detail for those skilled in the art to implement the present disclosure, it is necessary to understand that other implementations and forms are possible, and the change in configurations or structures and the substitution of various elements can be made without departing from the scope and spirit of the technical idea of the present disclosure. Therefore, the following description should not be construed as being limited thereto.

First Embodiment

First, a schematic configuration of a scanning electron microscope (SEM) as a charged particle beam device according to a first embodiment will be described with reference to FIG. 1. This SEM includes a column 1 which is an electron optical system, and a sample chamber 2.

The column 1 includes an electron gun 3 for generating an electron beam (charged particle beam) to be irradiated, a condenser lens 4, an aligner 5, an ExB filter 6, a deflector 7, and an objective lens 8, and functions as a charged particle beam irradiation unit. The condenser lens 4 and the objective lens 8 focus the electron beam generated by the electron gun 3 and irradiate a wafer 11 as a sample with the electron beam. The deflector 7 deflects the electron beam according to the applied voltage in order to scan the electron beam on the wafer 11. The aligner 5 is configured to generate an electric field for aligning the electron beam with respect to the objective lens 8. The ExB filter 6 is a filter for taking in the secondary electrons emitted from the wafer 11 into a secondary electron detector 9.

Further, the column 1 and the sample chamber 2 are provided with the secondary electron detector 9 (first detection unit) for detecting secondary electrons from the wafer 11 (sample) and a backscattered electron detector 10 (second detection unit) for detecting backscattered electrons from the wafer 11. The wafer 11 is placed on an XY stage 13 installed in the sample chamber 2. On the XY stage 13, a standard sample for beam calibration can be placed in addition to the wafer 11. Further, an optical microscope 14 for optically observing the wafer 11 is provided above the XY stage 13 in order to align the wafer 11.

The SEM further includes amplifiers 15 and 16, an electron optical system controller 17, a stage controller 18, an image processing unit 19, and a control unit 20. The amplifiers 15 and 16 amplify the detection signals from the secondary electron detector 9 and the backscattered electron detector 10 and output the amplified detection signals to the image processing unit 19. The electron optical system controller 17 controls the aligner 5, the ExB filter 6, the deflector 7, and the like in the column 1 according to a control signal from the control unit 20.

The stage controller 18 outputs a drive signal for driving the XY stage 13 according to a control signal from the control unit 20. The control unit 20 can be configured by, for example, a general-purpose computer.

According to the amplified detection signals received from the amplifiers 15 and 16, the image processing unit 19 generates an image P1 (first image P1) of the surface of the wafer 11 obtained based on the secondary electrons, and an image P2 (second image P2) of a lower layer of the surface obtained based on the backscattered electrons. The image processing unit 19 includes, for example, an edge extraction unit 1901, a smoothing processing unit 1902, and a matching processing unit 1903.

The edge extraction unit 1901 extracts the edges of the pattern included in the image (first image P1) of the surface of the wafer 11 and the image (second image P2) of the lower layer than the surface. The smoothing processing unit 1902 executes a smoothing process on the first image P1 and the second image P2, for example, as preprocessing of edge extraction by the edge extraction unit 1901.

FIG. 2 schematically shows the operation of the image processing unit 19. As schematically shown, the matching processing unit 1903 performs matching between the first image P1 after the smoothing process and the edge extraction, and a template image T1 for the first image P1. Further, the matching processing unit 1903 performs matching between the second image P2 after the smoothing process and the edge extraction, and a template image T2 for the second image P2. In accordance with the result of the matching, the control unit 20 adjusts the position of a measurement area and measures the amount of overlay deviation between the wafer surface and the lower layer. Here, the presence or absence of the smoothing process and the strength thereof, and whether to execute the edge extracting process can be selected for each image.

The control unit 20 controls the entire scanning electron microscope (SEM) via the electron optical system controller 17 and the stage controller 18. Although not shown, the control unit 20 may include an input unit such as a mouse or a keyboard for a user to input instructions, a display unit for displaying a captured image or the like, and a storage unit such as a hard disk or a memory. Further, the control unit 20 may include, for example, a template image generation unit 2001 that generates the above-described template image, a deviation amount measurement unit 2002 that measures the deviation amount of the pattern in the wafer 11, and a measurement area position adjusting unit 2003 that adjusts the position of a measurement area.

(Operation)

Next, a procedure of overlay measurement of a wafer (sample) in the scanning electron microscope according to the first embodiment will be described with reference to a flowchart of FIG. 3.

First, the control unit 20 receives a selection of the wafer 11 to be measured from a GUI screen displayed on an input unit (not shown) or a display unit (not shown), a selection of a recipe to be applied, and a selection of the necessity of performing overlay deviation measurement, and starts the overlay deviation measurement (Step S31). The control unit 20 loads the selected wafer 11 onto the XY stage 13 in the sample chamber 2 (Step S32).

Next, the control unit 20 executes the alignment of the wafer 11 based on the optical microscope image captured by the optical microscope 14 and the SEM image captured by the secondary electron detector 9 and/or the backscattered electron detector 10 (Step S33). Thereafter, the control unit 20 controls the XY stage 13 to move the wafer 11 to an overlay deviation measurement point registered in the recipe (Step S34a). The control unit 20 obtains a low-magnification SEM image to determine a position where the image should be obtained, and performs necessary adjustment (Step S34b).

In a succeeding step S34c, SEM images (the first image P1 and the second image P2) are obtained according to the imaging conditions registered in the recipe. The control unit 20 performs matching between the obtained SEM images (the first image P1 and the second image P2) and the template images T1 and T2 stored in the recipe, and adjusts the position of the measurement area in the first image P1 and the second image P2 according to the result of the matching (Step S34d). The recipe includes the first template image T1 relating to the secondary electron image (first image P1) based on a signal from the secondary electron detector 9, and the second template image T2 relating to the backscattered electron image (second image P2) based on a signal from the backscattered electron detector 10. In step S34c, matching between the first template image T1 and the first image P1 is performed, and matching between the second template image T2 and the second image P2 is performed. The method for generating and registering the first template image T1 and the second template image T2 will be described later.

In a succeeding step S34e, a difference in the position of the pattern image between the first image P1 and the second image P2 is specified based on the result of the matching (position adjustment of the measurement area) in step S34d. Based on this difference, the amount of overlay deviation between the first image P1 and the second image P2 is calculated. The control unit 20 determines whether the calculation of the amount of overlay deviation has been completed for all the measurement points specified in the recipe (Step S34f). When the measurement points remain (No), the control unit 20 moves the irradiation range of the electron beam to the next measurement point, and repeats the acquisition of the image and the calculation of the amount of overlay deviation. When the measurement has been completed for all the measurement points (Yes), the control unit 20 unloads the wafer 11 from the XY stage 13 (Step S35) and outputs the measurement result of the amount of overlay deviation (Step S36).

Figure 4B:
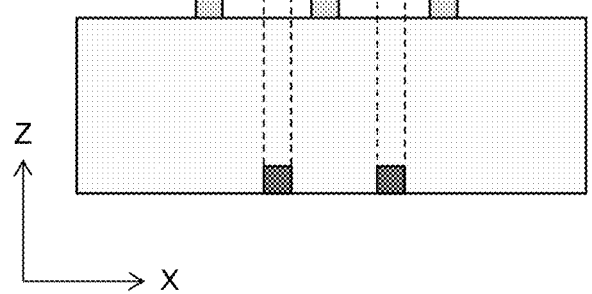

Next, with reference to FIGS. 4 and 5, the details of the procedure for registering the recipe (template image (T1 and T2), measurement area, etc.) used in step S34c in the flowchart of FIG. 3 will be described. FIG. 4 shows a configuration example of the wafer 11 as a sample. FIG. 4(a) is a plan view of the wafer 11, and FIG. 4 (b) is a cross-sectional view taken along the line C-C' of FIG. 4(a).

In FIG. 4, patterns 41a, 41b, and 41c are patterns formed on the surface of the wafer 11, and patterns 42a and 42b are patterns formed at positions in a lower layer than the surface of the wafer 11. The patterns 41a to 41c on the surface are mainly imaged as the first image P1 based on the output of the secondary electron detector 9. The lower layer patterns 42a and 42b are mainly imaged as the second image P2 based on the output of the backscattered electron detector 10. In this example, it is assumed that the three centers of gravity of the patterns 41a, 41b, and 41c are designed to coincide with the two centers of gravity of the patterns 42a and 42b.

Next, a specific example of a method for registering a template image and a measurement area in a recipe will be described with reference to FIG. 5.

Figure 5A:
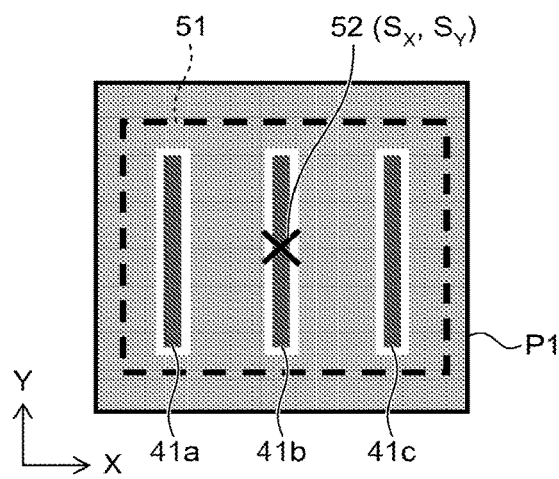
FIGS. 5A to 5F are schematic diagrams illustrating a specific example of a method for registering a template image and a measurement area in a recipe.

FIG. 5(a) is a secondary electron image (first image P1) of the wafer 11 shown in FIG. 4, and the first image P1 includes patterns 41a to 41c mainly formed on the surface of the wafer 11. The first image P1 as shown in FIG. 5(a) is displayed on a GUI screen of a display unit (not shown). When a template area 51 is set on the GUI screen by the user on the GUI screen, the control unit 20 calculates a center coordinate 52 (coordinate values ($S_X$, $S_Y$)) of the template area 51, and a template image 53 (first template image T1) as shown in FIG. 5(b) is stored as a part of the recipe.

Figure 5D:
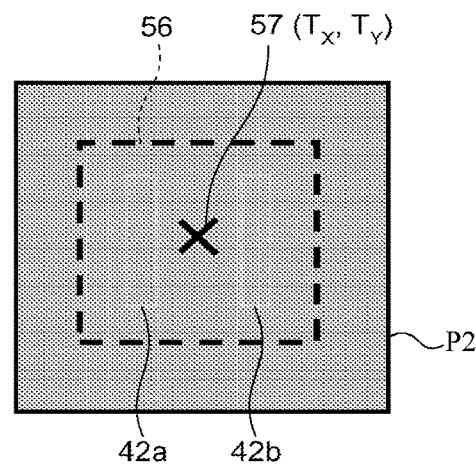
Figure 5B:
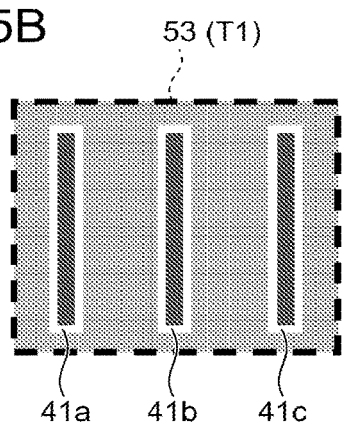
Figure 5E:
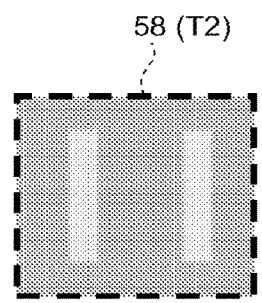
Figure 5C:
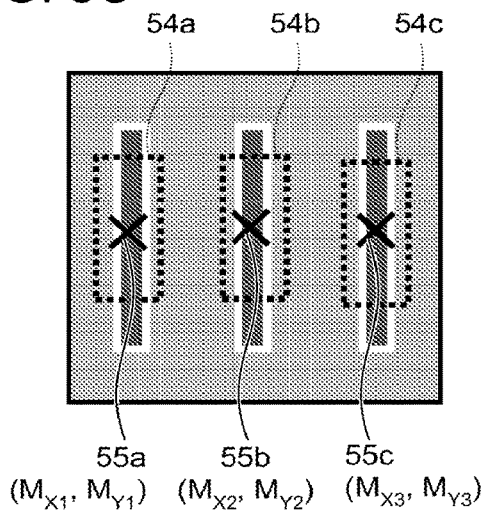

In addition, as shown in FIG. 5(c), in a state where the first image P1 is displayed on the GUI screen, measurement areas 54a, 54b, and 54c are set by the user at the positions of the patterns 41a to 41c. The measurement areas 54a to 54c are set as measurement areas for measuring the line width and the like of the patterns 41a to 41c. When the measurement areas 54a to 54c are set, the control unit 20 calculates center coordinates 55a (coordinate values ($M_{X1}$, $M_{Y1}$)), 55b (coordinate values ($M_{X2}$, $M_{Y2}$)), and 55c (coordinate values ($M_{X3}$, $M_{Y3}$)) of the measurement areas 54a to 54c, and further stores offset amounts ($\Delta M_{X1}$, $\Delta M_{Y1}$), ($\Delta M_{X2}$, $\Delta M_{Y2}$), and ($\Delta M_{X3}$, $\Delta M_{Y3}$) of the center coordinates 55a to 55c from the center coordinate 52 in the recipe. The offset amounts of the center coordinates 55a to 55c are also stored in the recipe as position information of the measurement areas 54a to 54c. The offset amounts ($\Delta M_{X1}$, $\Delta M_{Y1}$), ($\Delta M_{X2}$, $\Delta M_{Y2}$), and ($\Delta M_{X3}$, $\Delta M_{Y3}$) can be expressed as follows.

$$(\Delta M_{X1}, \Delta M_{Y1}) = (M_{X1}, M_{Y1}) - (S_X, S_Y)$$

$$(\Delta M_{X2}, \Delta M_{Y2}) = (M_{X2}, M_{Y2}) - (S_X, S_Y)$$

$$(\Delta M_{X3}, \Delta M_{Y3}) = (M_{X3}, M_{Y3}) - (S_X, S_Y)$$

FIG. 5(d) is a back scattered electron image (second image P2) of the wafer 11 shown in FIG. 4, and the second image P2 includes patterns 42a to 42b mainly located in the lower layer than the surface of the wafer 11. The second image P2 as shown in FIG. 5(d) is displayed on the GUI screen. When a template area 56 is set by the user on this GUI screen, the control unit 20 calculates a center coordinate 57 ($T_X$, $T_Y$) of the template area 56 and stores a template image 58 (second template image T2) shown in FIG. 5(e) as a part of the recipe.

Figure 5F:
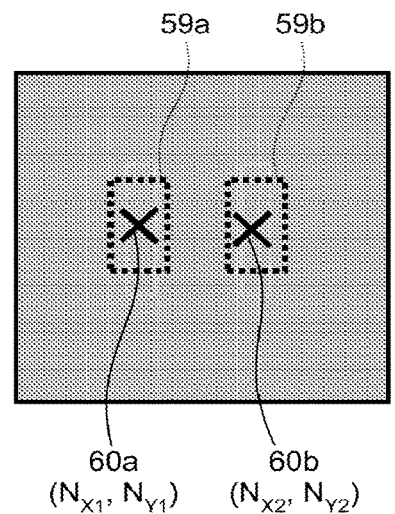

Further, as shown in FIG. 5(f), in a state where the second image P2 is displayed on the GUI screen, measurement areas 59a and 59b are set by the user at the positions of the patterns 42a and 42b. The measurement areas 59a and 59b are set as measurement areas for measuring the line width and the like of the patterns 42a and 42b. When the measurement areas 59a and 59b are set, the control unit 20 calculates center coordinates 60a (coordinate values ($N_{X1}$, $N_{Y1}$)) and 60b (coordinate values ($N_{X2}$, $N_{Y2}$)) of the measurement areas 59a and 59b, and further stores offset amounts ($\Delta N_{X1}$, $\Delta N_{Y1}$) and ($\Delta N_{X2}$, $\Delta N_{Y2}$) of the center coordinates 60a and 60b from the center coordinate 57 in the recipe. The offset amounts of the center coordinates 60a and 60b are stored in the recipe as position information of the measurement areas 59a and 59b. The offset amounts ($\Delta N_{X1}$, $\Delta N_{Y1}$) and ($\Delta N_{X2}$, $\Delta N_{Y2}$) can be expressed as follows.

$$(\Delta N_{X1}, \Delta N_{Y1}) = (N_{X1}, N_{Y1}) - (T_X, T_Y)$$

$$(\Delta N_{X2}, \Delta N_{Y2}) = (N_{X2}, N_{Y2}) - (T_X, T_Y)$$

Next, with reference to FIGS. 6 to 8, the details of the procedure of steps S34c to 34d in the flowchart of FIG. 3 will be described. Here, as shown in FIG. 5, a case where a deviation occurs between the first image P1 which is a pattern on the surface of the wafer 11 and the second image P2 in the lower layer than the surface will be described as an example.

Figure 6A:
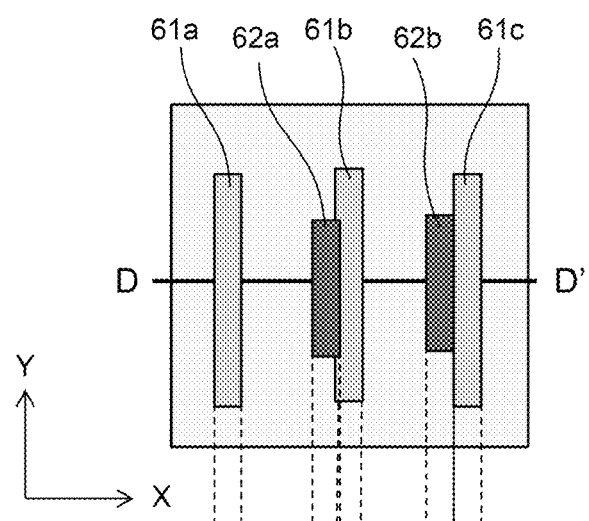
FIGS. 6A and 6B are schematic diagrams illustrating details of the procedure of steps S34c to 34d in the flowchart of FIG. 3.
Figure 6B:
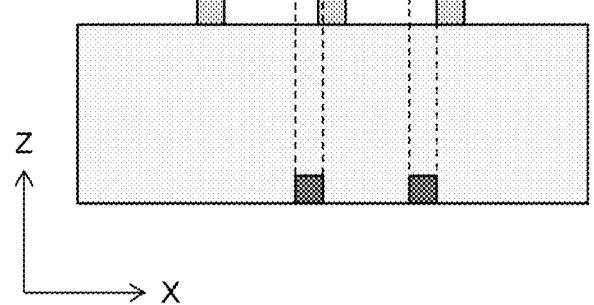

FIG. 6(a) is a plan view of the wafer 11, and FIG. 6(b) shows a cross section taken along the line D-D' of FIG. 6(a). Patterns 61a, 61b, and 61c are patterns formed on the surface of the wafer 11, and patterns 62a and 62b are patterns formed in a layer lower than the surface of the wafer 11. In the normal wafer 11, as shown in FIG. 4, the patterns 42a and 42b are located at intermediate positions between the patterns 41a to 41c. On the other hand, in the example of FIG. 6, the patterns 62a and 62b are formed at positions shifted in the +X direction from the positions where the patterns should be with respect to the patterns 61a, 61b, and 61c on the surface. In the present embodiment, by using the two of the template image T1 for the first image P1 and the template image T2 for the second image P2, even if an overlay deviation occurs between different layers, it is possible to accurately adjust the measurement area and to perform a stable and correct measurement.

Figure 7A:
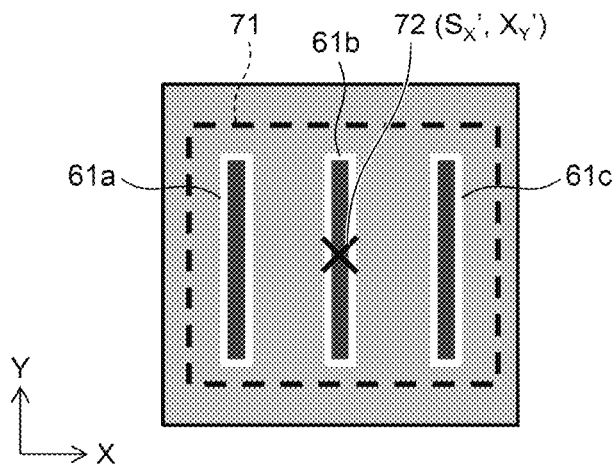
FIGS. 7A to 7C are schematic diagrams illustrating details of the procedure of steps S34c to 34d in the flowchart of FIG. 3.

As a comparative example, a case where only the template image T1 for the first image P1 is used as the template image, and the measurement position of the second image P2 is adjusted based on the template image T1 will be described. FIG. 7(a) shows the first image P1 (secondary electron image) obtained in step S34c, and specifies a matching range 71 in which the feature matches that of the template image T1 stored in the recipe. Then, a deviation amount ($\Delta S_X$, $\Delta S_Y$) of a center coordinate 72 (coordinate values ($S_X'$, $S_Y'$)) of the matching range 71 from the center coordinate 52 (coordinate values ($S_X$, $S_Y$)) of the template area 51 is calculated.

Figure 7B:
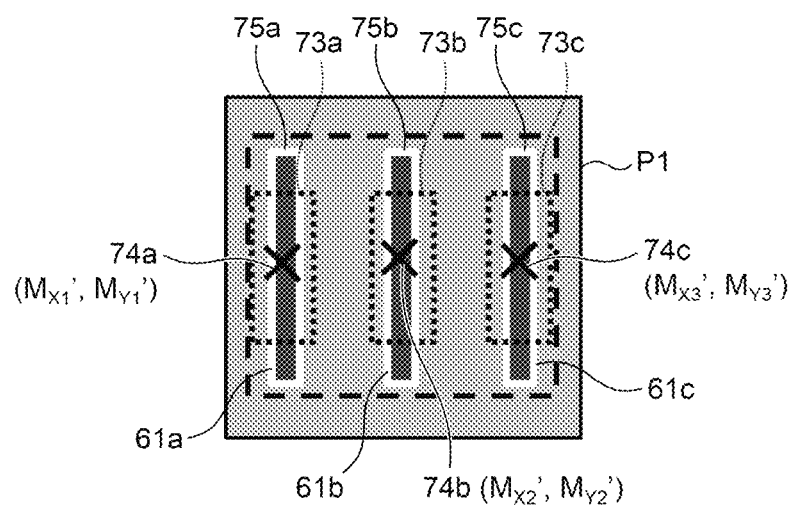

Based on the deviation amount ($\Delta S_X$, $\Delta S_Y$), the coordinate values ($M_{X1}'$, $M_{Y1}'$), ($M_{X2}'$, $M_{Y2}'$), and ($M_{X3}'$, $M_{Y3}'$) of the center coordinates 74a, 74b, and 74c of measurement areas 73a to 73c are as follows (See FIG. 7(b)).

$$(M_{X1}', M_{Y1}') = (S_X, S_Y) + (\Delta M_{X1}, \Delta M_{Y1}) + (\Delta S_X, \Delta S_Y)$$

$$(M_{X2}', M_{Y2}') = (S_X, S_Y) + (\Delta M_{X2}, \Delta M_{Y2}) + (\Delta S_X, \Delta S_Y)$$

$$(M_{X3}', M_{Y3}') = (S_X, S_Y) + (\Delta M_{X3}, \Delta M_{Y3}) + (\Delta S_X, \Delta S_Y)$$

Here, when the adjustment of the image acquisition position (process S34b) is performed on the first image P1, it is considered that there is almost no positional deviation ($\Delta S_X$, $\Delta S_Y$) of the surface pattern. Therefore, if $\Delta S_X=0$ and $\Delta S_Y=0$, the coordinate values ($M_{X1}'$, $M_{Y1}'$), ($M_{X2}'$, $M_{Y2}'$), and ($M_{X3}'$, $M_{Y3}'$) of the center coordinates 74a, 74b, and 74c of the measurement areas 73a to 73c are as follows.

$$(M_{X1}', M_{Y1}') = (S_X, S_Y) + (\Delta M_{X1}, \Delta M_{Y1})$$

$$(M_{X2}', M_{Y2}') = (S_X, S_Y) + (\Delta M_{X2}, \Delta M_{Y2})$$

$$(M_{X3}', M_{Y3}') = (S_X, S_Y) + (\Delta M_{X3}, \Delta M_{Y3})$$

That is, the positions of the measurement areas 73a, 73b, and 73c are the same as the positions of the measurement areas set as the recipe.

Since the adjustment of the image acquisition position is performed on the first image P1 which is the secondary electron image, the positions of the surface patterns 61a, 61b, and 61c in the image are also the same as those at the time of setting the recipe. Therefore, the respective measurement areas 73a, 73b, and 73c are set correctly for the surface patterns 61a, 61b, and 61c.

On the other hand, when only the template image T1 for the first image P1 is used as the template image and the position of the measurement area of the second image P2 is adjusted based on the template image T1, there is a concern that the measurement area is not set correctly for the patterns 62a and 62b, and as a result, the measurement is not performed correctly, as described later. This will be described with reference to FIG. 7(c).

Figure 7C:
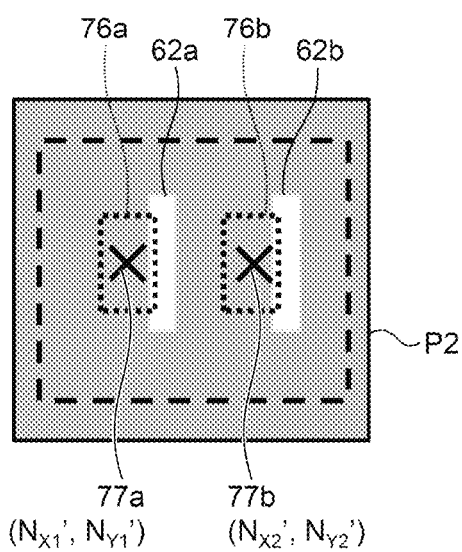

FIG. 7(c) shows an example of the second image P2 (backscattered electron image) obtained simultaneously with the first image P1 (secondary electron image) of FIG.

7(a) when the wafer 11 as shown in FIG. 6 is imaged. In the second image P2, the patterns 62a and 62b are imaged shifted from the normal position in the +X direction.

In such a second image P2, center coordinates 77a and 77b (coordinate values ($N_{X1}'$, $N_{Y1}'$), and ($N_{X2}'$, $N_{Y2}'$)) of measurement areas 76a and 76b for measuring the patterns 62a and 62b are as follows, respectively:

$$(N_{X1}',N_{Y1}')=(S_X',S_Y')+(\Delta N_{X1},\Delta N_{Y1})+(\Delta S_X,\Delta S_Y)$$

$$(N_{X2}',N_{Y2}')=(S_X',S_Y')+(\Delta N_{X2},\Delta N_{Y2})+(\Delta S_X,\Delta S_Y)$$

Assuming that $\Delta S_X=0$ and $\Delta S_Y=0$ as described above, the following is obtained.

$$(N_{X1}',N_{Y1}')=(S_X',S_Y')+(\Delta N_{X1},\Delta N_{Y1})$$

$$(N_{X2}',N_{Y2}')=(S_X',S_Y')+(\Delta N_{X2},\Delta N_{Y2})$$

That is, when the position adjustment is performed based only on the template image T1 for the first image P1, the positions of the measurement areas 76a and 76b are the same as those at the time of setting the recipe. On the other hand, the patterns 62a and 62b in the second image P2 are shifted in the +X direction from the image at the time of setting the recipe. For this reason, a problem arises in that the measurement areas 76a and 76b are set to be shifted leftward from internal patterns 78a and 78b, and correct positional deviation measurement cannot be performed.

Next, referring to FIG. 8, a procedure for adjusting the position of the measurement area by using two template images of the template image T1 for the first image P1 and the template image T2 for the second image P2 according to the first embodiment of the present invention is described. FIG. 8(a) is an example of the first image P1 (secondary electron image) obtained in step 34c (FIG. 3) which is the image acquisition sequence of the recipe. Here, the matching range 71 in which the feature matches that of the template image T1 stored in the recipe is specified. Then, the deviation amount ($\Delta S_X$, $\Delta S_Y$) of the center coordinate 72 (coordinate values ($S_X'$, $S_Y'$)) of the matching range 71 from the center coordinate 52 (coordinate values ($S_X$, $S_Y$)) of the template area 51 is calculated. Assuming that $\Delta S_X=0$ and $\Delta S_Y=0$ for the same reason as in the example in FIG. 7, the coordinate values ($M_{X1}'$, $M_{Y1}'$), ($M_{X2}'$, $M_{Y2}'$), and ($M_{X3}'$, $M_{Y3}'$) of the center coordinates 74a, 74b, and 74c of the measurement areas 73a, 73b, and 73c are as follows.

$$(M_{X1}',M_{Y1}')=(S_X,S_Y)+(\Delta M_{X1},\Delta M_{Y1})$$

$$(M_{X2}',M_{Y2}')=(S_X,S_Y)+(\Delta M_{X2},\Delta M_{Y2})$$

$$(M_{X3}',M_{Y3}')=(S_X,S_Y)+(\Delta M_{X3},\Delta M_{Y3})$$

Since the adjustment of the image acquisition position is performed on the first image P1 which is the secondary electron image, the positions of the surface patterns 61a, 61b, and 61c in the image are also the same as those at the time of setting the recipe. Therefore, the respective measurement areas 73a, 73b, and 73c are set correctly for the surface patterns 61a, 61b, and 61c.

Figure 8A:
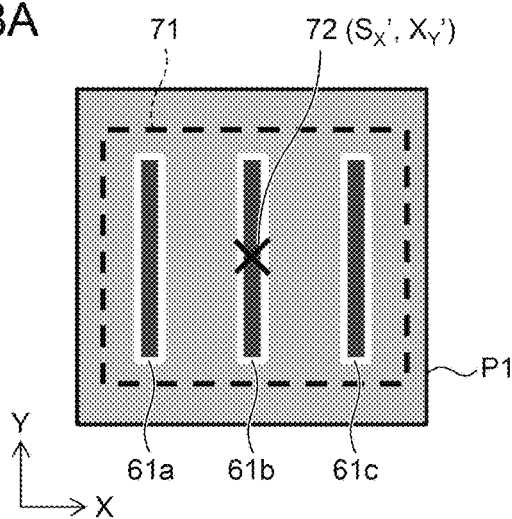
FIGS. 8A to 8D are schematic diagrams illustrating details of the procedure of steps S34c to 34d in the flowchart of FIG. 3.
Figure 8C:
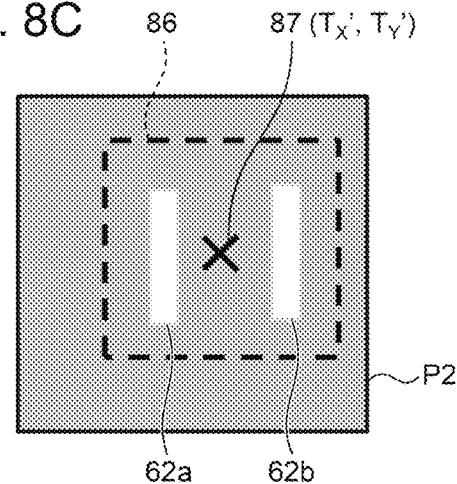
Figure 8B:
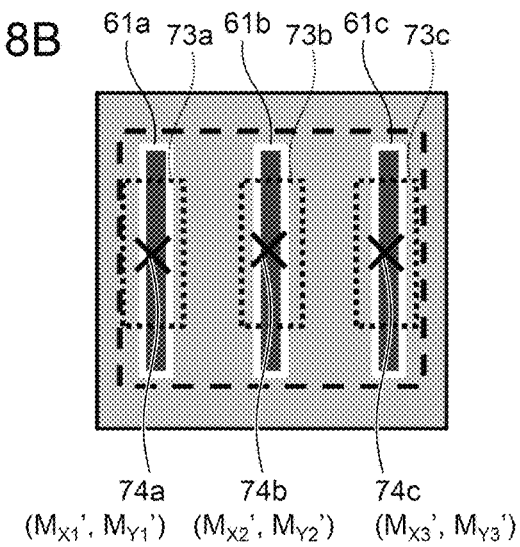
Figure 8D:
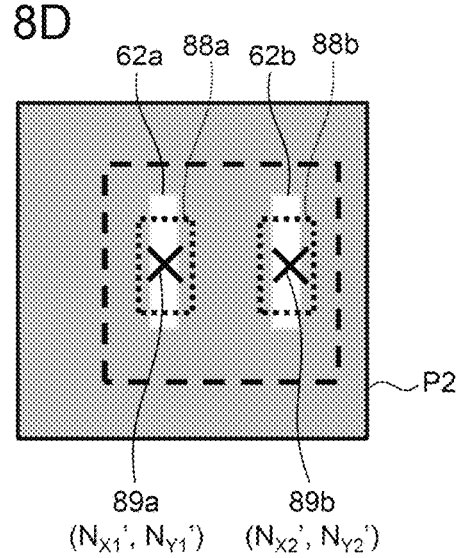

FIG. 8(c) shows an example of the second image P2 (backscattered electron image) obtained simultaneously with the first image P1 (secondary electron image) of FIG. 8 (a) when the wafer 11 as shown in FIG. 6 is imaged. A matching range 86 in which the feature matches that of the template image T2 stored in the recipe is specified. Then, a deviation amount ($\Delta T_X$, $\Delta T_Y$) of a center coordinate 87 (coordinate values ($T_X'$, $T_Y'$)) of the matching range 86 from the center coordinate 57 (coordinate values ($T_X$, $T_Y$)) of the template area 56 at the time of registering the recipe is calculated. Coordinate values ($N_{X1}'$, $N_{Y1}'$) and ($N_{X2}'$, $N_{Y2}'$) of center coordinates 89a and 89b of measurement areas 88a and 88b are calculated as follows based on the deviation amount of the position of the template image T2.

$$(N_{X1}',N_{Y1}')=(T_X,T_Y)+(\Delta N_{X1},\Delta N_{Y1})+(\Delta T_X,\Delta T_Y)$$

$$(N_{X2}',N_{Y2}')=(T_X,T_Y)+(\Delta N_{X2},\Delta N_{Y2})+(\Delta T_X,\Delta T_Y)$$

As described above, the positions of the measurement areas 88a and 88b are shifted by ($\Delta T_X$, $\Delta T_Y$) from the position at the time of setting the recipe. ($\Delta T_X$, $\Delta T_Y$) indicate the deviation amount of the patterns 62a and 62b on the second image P2 from the position at the time of setting the recipe. Therefore, the respective measurement areas 88a and 88b are set at positions matching patterns 62a and 62b.

Figure 9A:
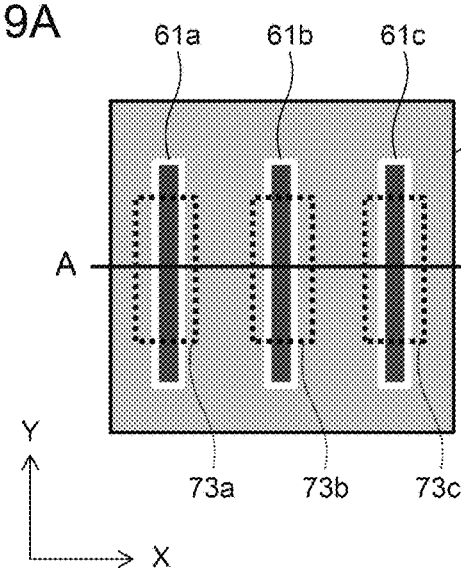
FIGS. 9A to 9D are schematic diagrams illustrating a specific example of a calculation process performed by a control unit 20.

Next, a specific example of the calculation process performed by the control unit 20 will be described. FIG. 9(a) is an example of the first image P1 based on the detection signal output from the secondary electron detector 9. The first image P1 includes images of the patterns 61a, 61b, and 61c formed on the surface of the wafer 11. The change curve of the signal intensity along the line A-A' in FIG. 9(a) has peaks at positions corresponding to the edges of the patterns 61a to 61c as shown in FIG. 9(b). The control unit 20 calculates the edge positions and the center positions of gravity of the patterns 61a to 61c in the measurement areas 73a, 73b, and 73c according to the change in the signal intensity.

Specifically, it is assumed that the X coordinate of the edge position of the pattern 61a in the measurement area 73a is determined to be $a_1$ and $a_2$; the X coordinate of the edge position of the pattern 61b in the measurement area 73b is determined to be $a_3$ and $a_4$; and the X coordinate of the edge position of the pattern 61c in the measurement area 73c is determined to be $a_5$ and $a_6$. In this case, the X coordinates $a_{c1}$, $a_{c2}$, and $a_{c3}$ of the center positions of gravity of the patterns 61a, 61b, and 61c are given by the following equations.

$$a_{c1}=(a_1+a_2)/2$$

$$a_{c2}=(a_3+a_4)/2$$

$$a_{c3}=(a_5+a_6)/2$$

The X coordinate $a_c$ of the center position of gravity of the three patterns 61a to 61c is given by the following equation.

$$a_c=(a_{c1}+a_{c2}+a_{c3})/3$$

Figure 9C:
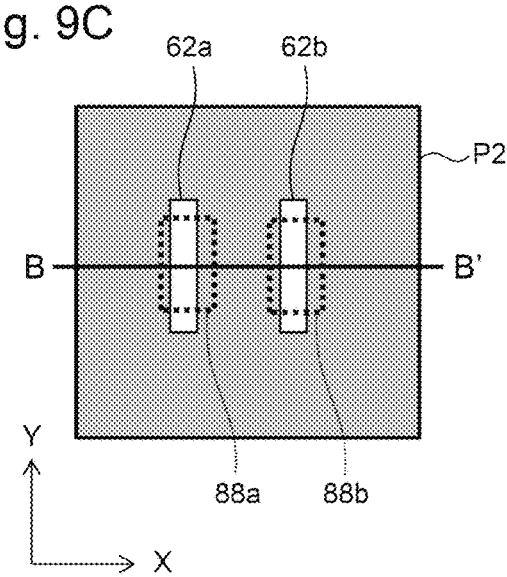
Figure 9B:
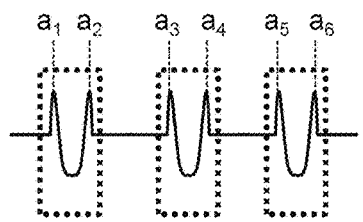
Figure 9D:
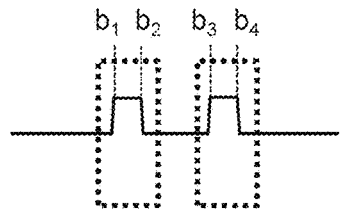

FIG. 9(c) is an example of the second image P2 based on the detection signal output from the backscattered electron detector 10. The second image P2 includes images of the patterns 62a and 62b formed in the lower layer than the surface of the wafer 11. As shown in FIG. 9(d), in the change curve of the signal intensity along the line B-B' in FIG. 9(c), the signal intensity changes depending on the difference of the substances constituting the patterns in the portions of the patterns 62a and 62b. That is, the second image P2 is an image having high contrast in the portions of the patterns 62a and 62b. The control unit 20 calculates the edge position and the center positions of gravity of the patterns 62a and 62b in the measurement areas 88a and 88b according to the change of the contrast, that is, the change of the signal intensity.

Specifically, it is assumed that the X coordinate of the edge position of the pattern 62a in the measurement area 88a is determined to be $b_1$ and $b_2$, and the X coordinate of the edge position of the pattern 62b in the measurement area 88b is determined to be $b_3$ and $b_4$. In this case, the X coordinates $b_{c1}$ and $b_{c2}$ of the center positions of gravity of the patterns 62a and 62b are given by the following equations.

$$b_{c1}=(b_1+b_2)/2$$

$$b_{c2}=(b_3+b_4)/2$$

Further, the X coordinate $b_c$ of the center position of gravity of the two patterns 62a and 62b is given by the following equation.

$$b_c=(b_{c1}+b_{c2})/2$$

Then, the amount of overlay deviation Δx between the patterns 61a to 61c on the surface and the patterns 62a to 62b in the lower layer thereof is obtained by the following equation.

$$\Delta x=b_c-a_c$$

As described above, according to the first embodiment, the first image P1 including the image of the pattern located on the surface of the wafer 11 is generated based on the output of the secondary electron detector 9, and the second image P2 including the image of the pattern located in the lower layer than the surface of the wafer 11 is generated based on the output of the backscattered electron detector 10. Then, for the first image P1, the measurement area is adjusted by the template image T1 generated for the first image P1, and for the second image P2, the measurement area is adjusted by the template image T2 separately generated for the second image P2. As a result, the amount of overlay deviation is calculated. Therefore, according to the first embodiment, even when the amount of overlay deviation of patterns formed over a plurality of layers on the wafer 11 is large, correct measurement of the amount of overlay deviation can be stably performed.

Second Embodiment

Next, a scanning electron microscope (SEM) as a charged particle beam device according to a second embodiment of the present invention will be described with reference to FIGS. 10 to 17. The device of the second embodiment is similar to that of the first embodiment in that the template image T1 for a secondary electron image and the template image T2 for a backscattered electron image are used. This embodiment is different from the first embodiment in a user interface screen for registering a template image and the like.

Figure 10A:
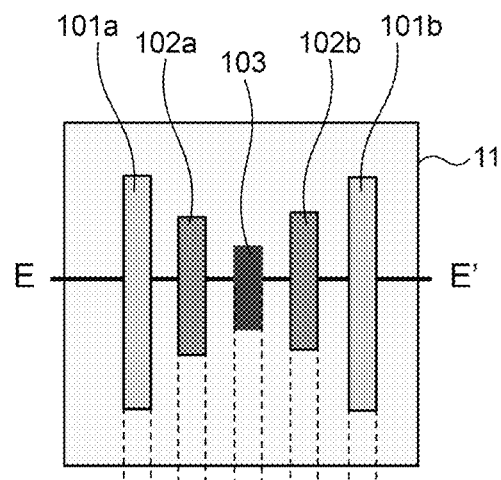
FIGS. 10A and 10B are schematic diagrams showing a configuration example of the wafer 11 to be measured in a second embodiment.
Figure 10B:
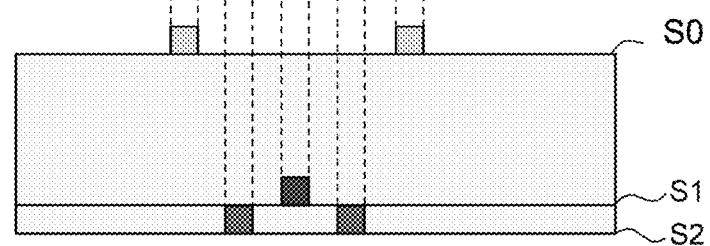

In the second embodiment, for convenience of description, a case where a pattern is formed over three layers on the wafer 11 as shown in FIG. 10 will be described as an example. However, it is needless to say that the device of the second embodiment is not limited to the measurement of a wafer having such a structure. FIG. 10(a) is a plan view of the wafer 11 viewed from the irradiation direction of the irradiation electrons, and FIG. 10 (b) is a cross-sectional view taken along the line E-E' of FIG. 10(a).

Patterns 101a and 101b are formed on a surface S0 of the wafer 11, and a pattern 103 is formed on a first layer S1 below the surface S0 (inside the wafer 11). Further, patterns 102a and 102b are formed in a second layer S2 lower than the first layer S1. In the design data, the center positions of gravity of the two patterns 101a and 101b, the center positions of gravity of the two patterns 102a and 102b, and the center position of gravity of the pattern 103 of the wafer 11 shown in FIG. 10 are all designed to coincide with each other.

Next, an example of a graphical user interface (GUI) screen 111 of the scanning electron microscope (SEM) according to the second embodiment will be described with reference to FIGS. 11 to 16. On the GUI screen 111, various setting operations including registration and deletion of template images, registration and deletion of measurement conditions, and registration and deletion of measurement coordinates can be performed. As described above, in the device according to the present embodiment, the template image T1 for the first image P1 which is a secondary electron image and the template image T2 for the second image P2 which is a backscattered electron image can be registered as a part of the data constituting the recipe. When the wafer 11 as shown in FIG. 10 is the target, template images T2' and T2" can be registered for the second image P2 for each of the multiple layers S1 and S2.

Referring to FIGS. 11 and 12, a procedure of registering the template image T1 for the first image P1 (secondary electron image) and registering the measurement condition on the GUI screen 111 will be described. As shown in FIG. 11, on the GUI screen 111, a map display area 112, an image display area 113, and a recipe condition display area 114 are arranged.

The map display area 112 is an area capable of selectively displaying a wafer map image enabling to grasp the entire image of the wafer 11 or a chip map image enabling to grasp the structure of a chip constituting a part of the wafer 11. Switching between the display of the wafer map image and the display of the chip map image can be performed by clicking a wafer map selection button 115a or a chip map selection button 115b disposed below the map display area 112. FIG. 11 shows a state in which the chip map is selected and displayed. In order to indicate that the chip map is selected, the chip map selection button 115b is highlighted. By clicking a desired position (116) of the chip map image in a state where the chip map image is displayed in the map display area 112, the XY stage 13 can be moved to the selected position (116) in the chip map image.

The image display area 113 is an area for displaying a captured SEM image (first image P1 (secondary electron image) or second image P2 (backscattered electron image)). The image display area 113 can selectively display the first image P1 or the second image P2, and the display can be switched by clicking a secondary electron image selection button 117a or a backscattered electron image selection button 117b. FIG. 11 exemplarily shows a state in which the secondary electron image selection button 117a is clicked, and thereby the image display area 113 displays the first image P1. At a position adjacent to the image display area 113, a display magnification change button 118, an image acquisition button 119, an image condition setting button 120, a template selection button 121, a measurement area selection button 122, and a measurement point selection button 148 are displayed.

The display magnification change button 118 is a button for changing the display magnification of the SEM image (first image P1 or second image P2) displayed in the image display area 113. The image acquisition button 119 is a button for obtaining an SEM image and displaying the obtained image in the image display area 113, and for giving an instruction to store the image data of the SEM image in a memory (not shown). The image condition setting button 120 is a button for setting image conditions other than the display magnification.

The template selection button 121 is a button for giving an instruction to display a screen for selecting a template image. The measurement area selection button 122 is a button for setting a mode for setting a measurement area for the first image P1 or the second image P2. The measurement point selection button 148 is a button for selecting a mode for selecting a measurement point in the first image P1 or the second image P2.

The recipe condition display area 114 is a display area for registering and deleting template images, measurement conditions, and measurement coordinates as data constituting a part of the recipe. Above the recipe condition display area 114, a template registration tab 123, a measurement condition registration tab 124, and a measurement coordinate registration tab 125 are arranged.

When the template registration tab 123 is clicked, a screen for registering or deleting a template image is displayed in the recipe condition display area 114. On the template image registration screen of the recipe condition display area 114, as an example, display fields of template images are arranged for each type of the image. The template image display field may include, for example, a first registration screen 126 for registering the template image T for the first image P1 (secondary electron image of the surface S0), a second registration screen 127 for registering the template image T2' (BSE-1) for the first layer S1 of the backscattered electron image, and a third registration screen 128 (BSE-2) for registering the template image T2" for the second layer S2 of the backscattered electron image.

When the measurement condition registration tab 124 is clicked, a screen for registering or deleting various measurement conditions is displayed in the recipe condition display area 114 (details will be described later with reference to FIGS. 12 and 14). Further, when the measurement coordinate registration tab 125 is clicked, a screen for registering or deleting measurement coordinates is displayed in the recipe condition display area 114 (details will be described later with reference to FIG. 16).

When the image acquisition button 119 is clicked after the XY stage 13 has moved to the position 116, an SEM image (first image P1 and second image P2) is obtained. When registering the template image T1 for the first image P1 which is the secondary electron image, first, the secondary electron image selection button 117*a* is clicked to display the first image P1 in the image display area 113. Subsequently, a template selection mode is set by the template selection button 121. Thereafter, the template area 126 is selected based on the first image P1 displayed in the image display area 113.

When the register button 129*b* below the template image T1 is clicked in a state where the template image T1 is displayed on the first registration screen 126, the displayed template image T1 is registered. When the registration is completed, the registered template image 129*a* is displayed on the first registration screen 126. The registered template image 129*a* can also be deleted by clicking a delete button 129*c*. The registration and deletion of the template image T2 (T2' and T2") for the second image P2 can be performed by the same procedure using the registration screens 127 and 128, the register buttons 130*b* and 131*b*, and the delete buttons 130*c* and 131*c*.

FIG. 12 shows a state in which the measurement condition registration tab 124 is clicked on the GUI screen 111, and a measurement condition registration screen for the first image P1 is displayed in the recipe condition display area 114. In the registration of the measurement conditions for the first image P1 which is the secondary electron image, the measurement area selection mode is set by clicking the measurement area selection button 122 in a state where the first image P1 is displayed in the image display area 113. On the first image P1 displayed in the image display area 113, the measurement areas 140*a* and 140*b* are selected.

When the measurement condition registration tab 124 is clicked after the measurement area selection button 122 is clicked, a measurement location display area 141, a pattern position measurement condition display area 142, and an overlay deviation measurement condition display area 143 are displayed in the recipe condition display area 114.

In the measurement location display area 141, the first image P1 or the second image P2, and a graphic (e.g., a dotted rectangular graphic) indicating the measurement area are displayed. In the pattern position measurement condition display area 142, symbols indicating the type of the image to be measured (the first image P1 or the second image P2), symbols indicating the type of the template image to be used, and measurement conditions such as the measuring direction of the center of gravity are displayed in a list format in a pattern position measurement condition list 144*a*. When registering the displayed measurement condition, a register button 144*b* is clicked. When editing the displayed measurement condition, an edit button 144*c* is clicked, and when deleting the measurement condition, a delete button 144*d* is clicked.

The overlay deviation measurement condition display area 143 is an area for registering, editing, or deleting measurement conditions when measuring the overlay deviation of patterns formed over a plurality of layers of the wafer 11. The registration in an overlay deviation measurement condition list 145*a* is performed by displaying a window with a register button 145*b*. The registration of the overlay deviation measurement condition is possible only when at least two or more measurement conditions are registered in the pattern position measurement condition list 144*a*.

If the registered overlay deviation measurement condition is desired to be changed, an edit button 145*c* is clicked to display a window for edition. If the overlay deviation measurement condition is desired to be deleted, a delete button 145*d* is clicked to display a window for deletion.

Next, a procedure for registering the template image T2 for the second image P2 (backscattered electron image) and registering the measurement condition will be described with reference to FIGS. 13 and 14. As in the case of the first image P1, on the GUI screen 111, the map display area 112, the image display area 113, and the recipe condition display area 114 are arranged.

In FIG. 13, when the backscattered electron image selection button 117*b* is clicked, the second image P2 is displayed in the image display area 113. In this state, when the template selection button 121 is clicked, the template selection mode is set. After that, the template area 151 is selected based on the second image P2 displayed in the image display area 113.

When the register button 130*b* is clicked in a state where the template image T2' is displayed on the second registration screen 127, the displayed template image T2' is registered. When the registration is completed, the registered template image 130*a* (T2') is displayed on the second registration screen 127. The registered template image 130*a* can be deleted by clicking the delete button 130*c*.

Similarly, when a template area 152 is selected in a state where the second image P2 is displayed in the image display area 113, and the register button 131*b* of the third registration screen 128 in the recipe condition display area 114 is clicked, the displayed template image T2" is registered. At this time, a registered template image 131*a* (T2") is displayed on the third registration screen 128, but the template image 131*a* conceals patterns in different layers, and thereby a mask area 131d to be excluded from the matching value calculation target is set. The registered template image 131a can be deleted by clicking the delete button 131c.

FIG. 14 shows the GUI screen 111 in which the second image P2 is displayed in the image display area 113, the measurement condition registration tab 124 is clicked in a state where a measurement area 161 is selected, and a screen for registering measurement conditions for the second image P2 is displayed in the recipe condition display area 114. In the registration of the measurement conditions for the second image P2 for the first layer S1, the measurement area selection mode is set by clicking the measurement area selection button 122 in a state where the second image P2 and the measurement area 161 are displayed in the image display area 113. On the second image P2 displayed in the image display area 113, the measurement area 161 matching the pattern 103 is selected.

When the measurement condition registration tab 124 is clicked after the measurement area selection button 122 is clicked, the measurement location display area 141, the pattern position measurement condition display area 142, and the overlay deviation measurement condition display area 143 are displayed in the recipe condition display area 114. Hereinafter, various measurement conditions are registered in the same manner as in the case of the first image P1.

FIG. 15 shows the GUI screen 111 in which the second image P2 is displayed in the image display area 113, the measurement condition registration tab 124 is clicked in a state where measurement areas 171a and 171b are selected, and a screen for registering measurement conditions for the second image P2 is displayed in the recipe condition display area 114. In the registration of the measurement conditions for the second image P2 for the second layer S2, the measurement area selection mode is set by clicking the measurement area selection button 122 in a state where the second image P2 and the measurement areas 171a and 171b are displayed in the image display area 113. On the second image P2 displayed in the image display area 113, the measurement areas 171a and 171b matching the patterns 102a and 102b are selected.

When the register button 144b is clicked in a state where the measurement areas 171a and 171b are selected, the measurement condition of the second image P2 for the second layer S2 is registered in the third row of the pattern position measurement condition list. Here, in the measurement location display area 141, the measurement conditions selected in the pattern position measurement condition list 144a are graphically displayed.

The registration of the overlay deviation measurement condition can be performed by selecting a reference measurement condition (Base), measurement conditions for calculating the deviation from the reference, and the measuring direction of the center of gravity (X direction, Y direction, and XY direction) in the overlay deviation measurement condition list 145a displayed by the register button 145b of the overlay deviation measurement condition area 143. Here, as the measuring direction of the center of gravity, only the direction measured under the measurement condition can be selected. The registered overlay deviation measurement condition can be changed by the edit button 145c, and the condition can be deleted by the delete button 145d.

FIG. 16 shows the GUI screen 111 in which the measurement coordinate selection tab 125 is clicked in a state where the first image P1 is displayed in the image display area 113, and a screen for registering measurement coordinates is displayed in the recipe condition display area 114.

As shown in FIG. 16, when a selection point 146 on the map is clicked in a state where the wafer map is displayed in the map display area 112, the movement to any point on the wafer 11 is possible. In the registration of the measurement coordinates, the XY stage 13 is moved to a position where the measurement coordinates are desired to be registered while using the wafer map and the chip map properly. When the measurement point selection mode is set by clicking the measurement point selection button 148, a measurement point selection mark 147 is displayed at the center portion of the image display area 113. In this state, when the measurement coordinate registration tab 125 is clicked, a screen for registering measurement coordinates as shown in FIG. 16 is displayed in the recipe condition display area 114. The screen for registering measurement coordinates includes, for example, a measurement coordinate table 150a, a register button 150b, an edit button 150c, and a delete button 150d.

The measurement coordinate table 150a includes a list of the coordinates of the registered measurement points. When register button 150b is clicked, the coordinates of measurement point selection mark 147 indicated in the image display area 113 are registered in the measurement coordinate table 150. The measurement coordinates can be finely adjusted by the edit button 150c, and unnecessary measurement coordinates can be deleted by the delete button 150d.

Figure 17A:
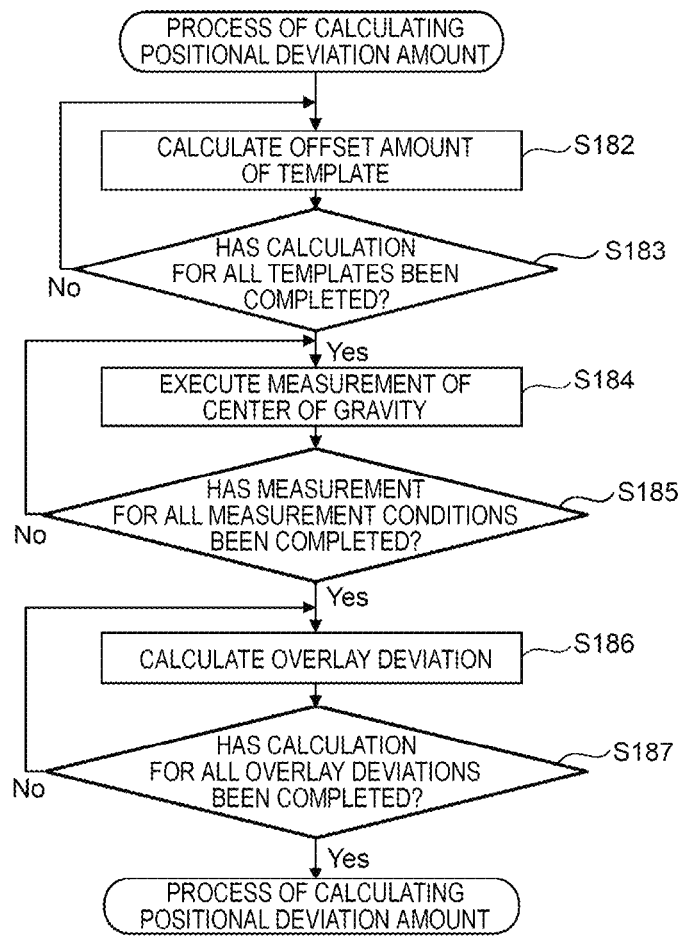
FIGS. 17A and 17B are flowcharts illustrating a procedure of overlay deviation measurement in the device according to the second embodiment.
Figure 17B:
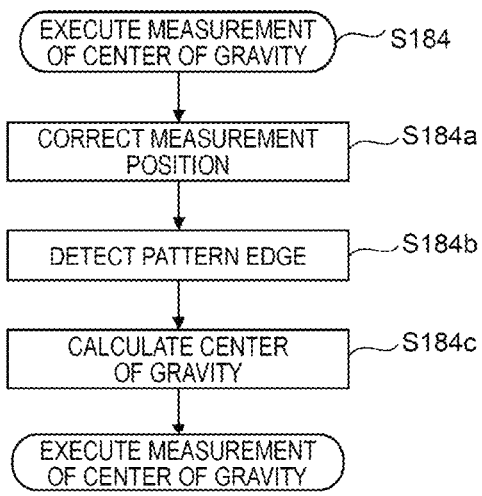

Hereinafter, a procedure of the overlay deviation measurement in the device according to the second embodiment will be described with reference to the flowchart in FIG. 17. FIG. 17 (a) is a flowchart illustrating the overall flow of the procedure, and FIG. 17 (b) is a flowchart illustrating step S184 in more detail.

First, for all the registered template images (for example, T1, T2', and T2''), the offset amount from the template image in the obtained SEM image is calculated by matching between the template image and the obtained SEM image (the first image P1 or the second image P2) (Steps S182 and S183).

Next, the center position of gravity of the pattern is measured for all the measurement conditions registered in the recipe (Steps S184 and S185). Here, the center position of gravity of the pattern can be measured by performing correction of the measurement position based on the offset amount of the corresponding template image (Step S184a), detection of the pattern edge position (Step S184b), and calculation of the center position of gravity based on the pattern edge position (Step S184c) in this order. Thereafter, the measurement area is adjusted based on the template image registered as a recipe, and the amount of overlay deviation between the patterns is calculated according to the adjustment amount (Steps S186 and S187).

Third Embodiment

Next, a scanning electron microscope (SEM) as a charged particle beam device according to a third embodiment of the present invention will be described with reference to FIGS. 18 to 22. The device according to the third embodiment is similar to that of the above-described embodiments in that the template image T1 for the secondary electron image (first image P1) and the template image T2 for the backscattered electron image (second image P2) are used. This embodiment is different from the above-described embodiments in the method for registering a template image.

FIG. 18 shows an example of the configuration of the wafer 11 to be measured in the device according to the third embodiment. FIG. 18 (a) is a front view of the wafer 11 viewed from the incident direction of the irradiation electrons, and FIG. 18 (b) shows a cross section taken along the line F-F' of FIG. 18 (a).

A pattern 201 having a vertical direction as a longitudinal direction is formed on the surface of the wafer 11, and patterns 202a and 202b having a lateral direction as a longitudinal direction are formed in a lower layer of the surface. The patterns 202a and 202b intersect the pattern 201 with the direction intersecting the pattern 201 as a longitudinal direction.

Figure 18A:
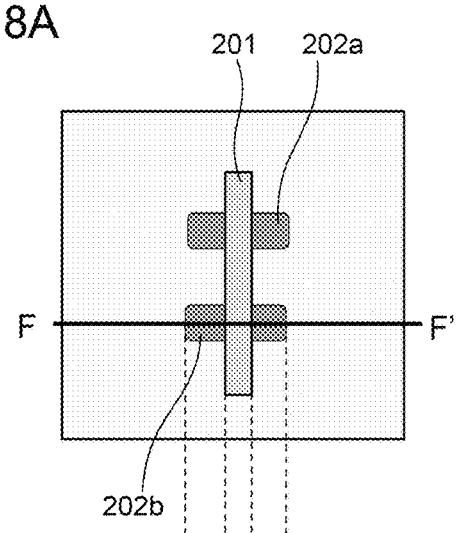
FIGS. 18A to 18D are schematic diagrams showing an example of a configuration of the wafer 11 to be measured in a device according to a third embodiment.
Figure 18B:
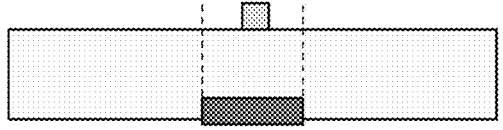
Figure 18C:
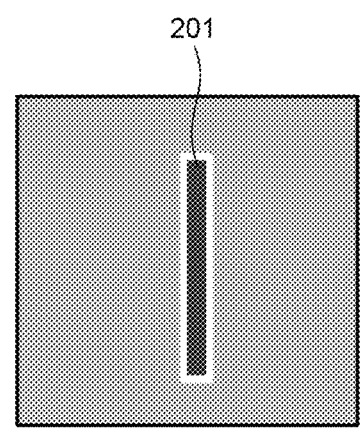
Figure 18D:
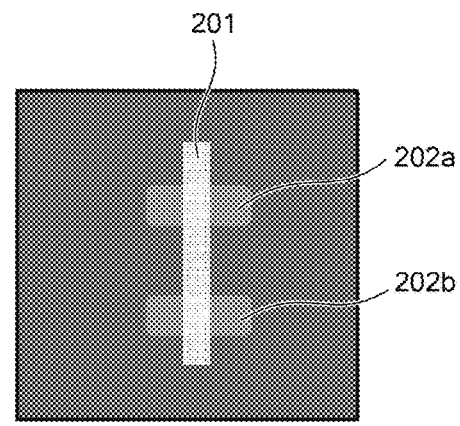

FIG. 18(c) is a secondary electron image (first image P1) of the wafer 11, which includes an image of the pattern 201 formed on the surface. FIG. 18(d) is a backscattered electron image (second image P2) of the wafer 11, in which a part of the patterns 202a and 202b in the lower layer of the wafer 11 is overlapped with the pattern 201 and is hidden.

A method for registering a template image according to a comparative example will be described with reference to FIG. 19. In this comparative example, one template area is selected so as to include the entire lower layer patterns 211a and 211b. Such a method may cause the following problem in a wafer having an overlapping pattern arrangement in the upper and lower layers as shown in FIG. 19.

Figure 19A:
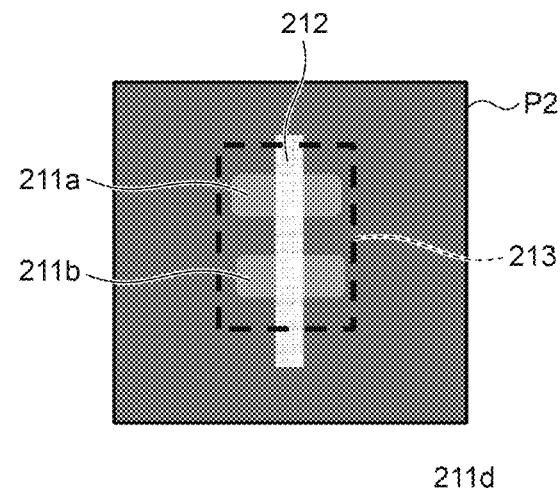
FIGS. 19A to 19C are schematic diagrams illustrating a method for registering a template image according to a comparative example.

In the backscattered electron image (second image P2) shown in FIG. 19(a), the lower layer patterns 211a and 211b are formed without being overlay-deviated from the surface pattern 212. In this case, a template area 213 is selected so as to include the entire lower layer patterns 211a and 211b.

Figure 19B:
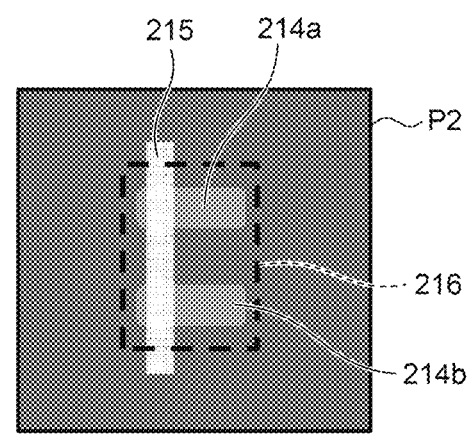
Figure 19C:
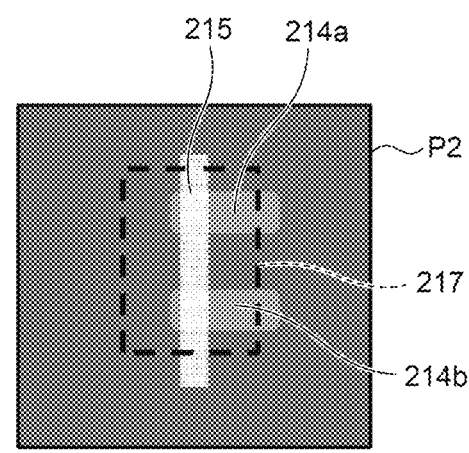

FIGS. 19(b) and 19(c) show the case where lower layer patterns 214a and 214b are formed at positions shifted to the right with respect to a surface pattern 215. In this case, as shown in FIG. 19 (b), a template area 216 needs to be selected so as to include the lower layer patterns 214a and 214b.

However, when the contrast of the surface pattern 215 is high with respect to the backscattered electron image (second image P2), as shown in FIG. 19(c), a template area 217 that includes the surface pattern 215 but does not include the entire lower layer patterns 214a and 214b may be selected. In this case, an appropriate template image T2 cannot be set for the lower layer patterns.

Therefore, in the third embodiment, the following method is employed for registering a template image on a wafer having an overlapping pattern as shown in FIG. 18 to solve this problem.

Figure 20A:
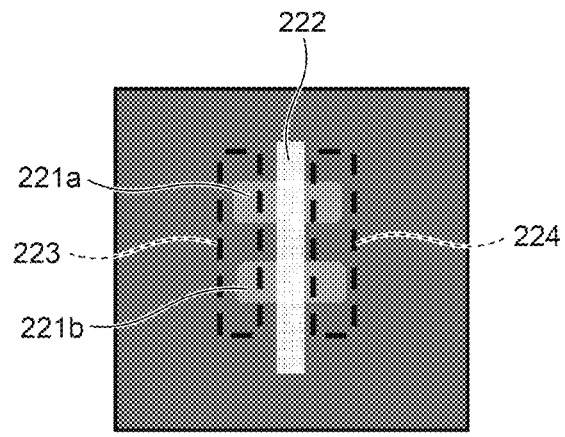
FIGS. 20A to 20C are schematic diagrams illustrating a method for registering a template image according to the third embodiment.

A method for registering a template image according to the third embodiment will be described with reference to FIG. 20. When the second image P2 as shown in FIG. 20(a) is obtained, a plurality of (for example, two) template areas (a first template area 223 and a second template area 224) can be set for lower layer patterns 221a and 221b. The first template area 223 is set to include ends on one side (left ends) of the patterns 221a and 221b. On the other hand, the second template area 224 is set to include ends on the other side (right ends) of the patterns 221a and 221b. The template image T2 is set according to the two types of template areas 223 and 224.

Figure 20B:
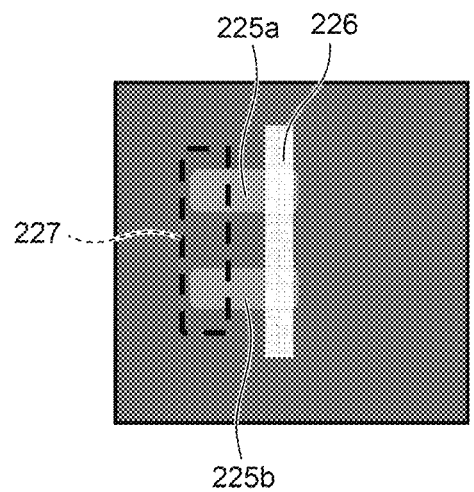

On the other hand, as shown in FIG. 20(b), lower layer patterns 225a and 225b are shifted to the left with respect to a surface pattern 226, and the right ends of the lower layer patterns 225a and 225b may not have a position where the template area is arranged. In this case, a template area 227 is set only at the left ends of the lower layer patterns 225a and 225b. When this one template area 227 is set, a corresponding template image T2 can be set.

Figure 20C:
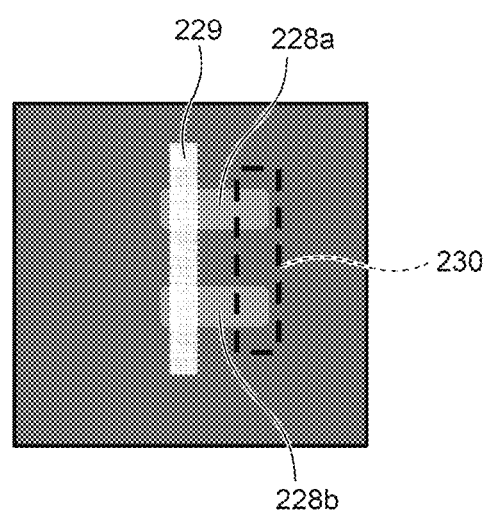

Further, as shown in FIG. 20(c), lower layer patterns 228a and 228b are shifted to the right with respect to a surface pattern 229, and the left ends of the lower layer patterns 228a and 228b may not have a position where the template area is arranged. In this case, a template area 230 is set only at the right ends of the lower layer patterns 228a and 228b. When this one template area 230 is set, a corresponding template image T2 can be set.

In this way, by allowing a plurality of template areas (the first template area and the second template area) to be set in the second image P2, even when the lower layer pattern is shifted in any direction with respect to the surface pattern, an appropriate template image can be set.

Referring to FIGS. 21 and 22, an example of the GUI screen 111 for registering a template image in the device according to the third embodiment and an operation procedure thereof will be described. FIGS. 21 and 22 describe the case where two template images are registered for one second image P2, and also describe the effects thereof.

A procedure for registering a template image for the second image P2 which is a backscattered electron image, on the GUI screen 111 will be described with reference to FIG. 21. In the screen shown in FIG. 21, the template selection button 121 is clicked to set the template selection mode. Then, template areas 231a and 231b are selected based on the second image P2 displayed in the image display area 113. The template areas 231a and 231b are preferably selected so that the image of the surface pattern 201 is not included.

When the register button 129c is clicked in a state where the two template areas 231a and 231b are selected as described above, the template image 129a corresponding to the template areas 231a and 231b is registered on the first registration screen 126.

Next, a procedure for registering another template image for the second image P2 on the GUI screen 111 will be described with reference to FIG. 22. In the screen of FIG. 22, the template selection button 121 is clicked to set the template selection mode, and then template areas 232a and 232b are selected based on the second image P2 displayed in the image display area 113. The template areas 232a and 232b are preferably selected at positions different from the template areas 231a and 231b and not including the image of the surface pattern 201.

When a register button 129e is clicked in a state where the two template areas 232a and 232b are selected as described above, a template image 129b corresponding to the template areas 232a and 232b is registered on the first registration screen 126. Here, the template image 129a can be used as a main template image in the second image P2, and the template image 129b can be used as a spare (sub) template image. The template image 129b may be used only when a sufficient matching rate is not obtained with the template image 129a and it is determined to be inappropriate. Alternatively, the respective matching rates of the template image 129a and the template image 129b are compared, and the one with a higher matching rate may be preferentially used. That is, when a plurality of template images are generated for the second image P2, the template image generation unit 2001 employs one of the plurality of template images based on the matching rate thereof with second image P2.

The template image 129a and the template image 129b may be simultaneously displayed on the first registration screen 126, or may be selectively displayed on the first registration screen 126 using a scroll bar 233. As a criterion for determining whether or not the template image 129a is inappropriate, an average value of shift amounts in matching of the template image 129a or the template image 129b may be used in addition to or instead of the matching rate.

Fourth Embodiment

Next, a scanning electron microscope (SEM) as a charged particle beam device according to a fourth embodiment of the present invention will be described with reference to FIGS. 23 and 24. The device according to the fourth embodiment is similar to that of the above-described embodiments in that the template image T1 for the secondary electron image and the template image T2 for the backscattered electron image are used. This embodiment is different from the above-described embodiments in a method for adjusting a measurement area and a method for specifying the amount of overlay deviation.

Figure 23A:
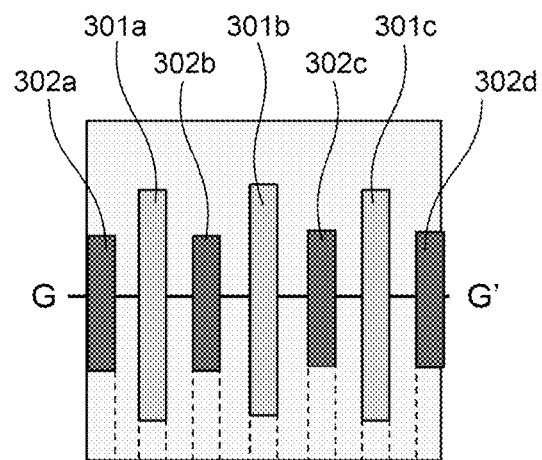
FIGS. 23A to 23C are schematic diagrams showing an example of a configuration of the wafer 11 to be measured in a fourth embodiment.
Figure 23B:
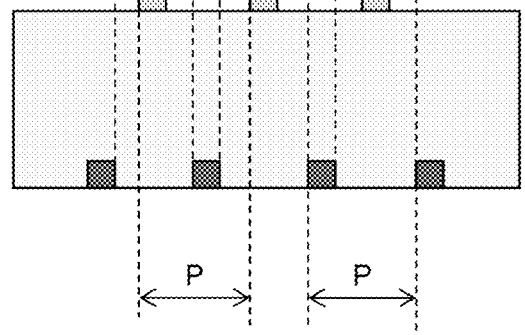

FIG. 23 shows an example of the configuration of the wafer 11 to be measured in the fourth embodiment. FIG. 23(a) is a front view of the wafer 11 viewed from the incident direction of the irradiation electrons, and FIG. 23(b) shows a cross section taken along the line G-G' of FIG. 23(a).

Figure 23C:
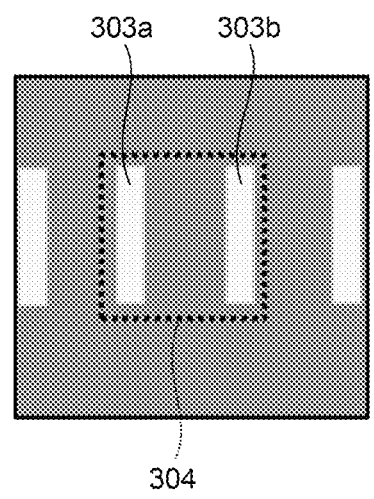

On the surface of the wafer 11, patterns 301a, 301b, and 301c having a vertical direction as a longitudinal direction are formed. The patterns 301a to 301c are periodically formed at equal intervals P in the X direction. Similarly, patterns 302a, 302b, 302c, and 302d having a vertical direction as a longitudinal direction are formed at positions in a lower layer than the surface of the wafer 11. The patterns 302a to c are periodically formed at equal intervals P, similarly to the patterns 301a to d on the surface. On the design data, the patterns 301a to c and 302a to d are formed at equal intervals of P/2 when viewed from the front of the wafer 11. As shown in FIG. 23(c), a template area 304 is set so as to include, for example, two pattern images 303a and 303b among a plurality of patterns of the backscattered electron image of the wafer 11.

Figure 24A:
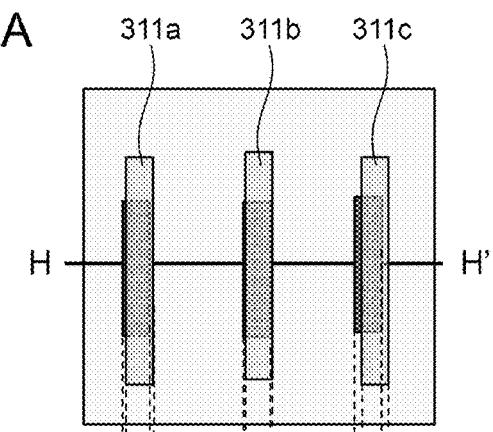
FIGS. 24A to 24F are schematic diagrams illustrating a procedure for determining an offset amount of a measurement point with reference to offset data of a nearby pattern position.
Figure 24B:
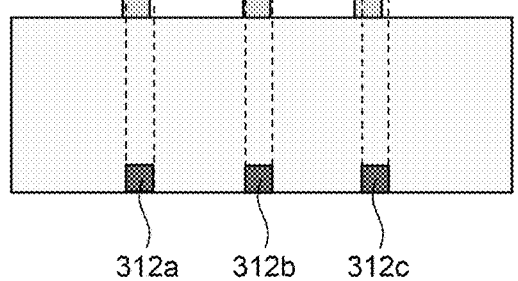

Next, a procedure for determining an offset amount of a measurement point with reference to offset data of a nearby pattern position will be described with reference to FIG. 24. FIG. 24(a) is a front view of the wafer 11 viewed from the incident direction of the irradiation electrons, and FIG. 24(b) shows a cross section taken along the line H-H' of FIG. 24 (a). On the design data, the wafer 11 has a structure in which patterns 301a to c and 302a to d are formed at equal intervals as shown in FIG. 23. In the actually manufactured wafer 11, lower layer patterns 312a, 312b, and 312c are offset with respect to the patterns 301a, 301b, and 301c by about a half (P/2) of the period P.

As described above, in some cases, it is unclear which direction of the left or right an offset has occurred when there is a pattern that extends in parallel between the upper and lower layers and the offset occurs. For this reason, the device according to the fourth embodiment is configured to specify the direction in which the offset has occurred, to adjust the measurement area position according to the specified result, and further to measure the overlay deviation, by the method described later.

FIGS. 24 (c) and 24 (d) show examples of the backscattered electron image (second image P2) obtained by imaging the wafer 11 shown in FIG. 24(a) and matching positions 313 and 315 to be set. The second images P2 in FIGS. 24(c) and 24(d) show images after the position adjustment has been performed so that the positions of the surface patterns 301a to d coincide with the positions in the template image T1.

Figure 24C:
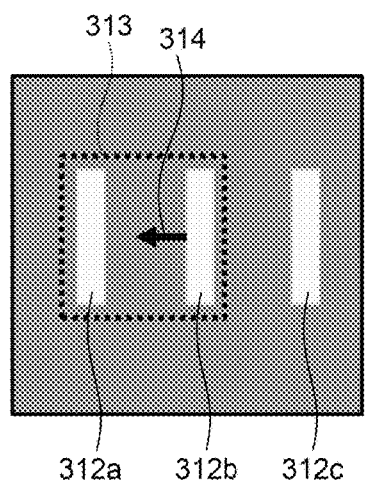
Figure 24D:
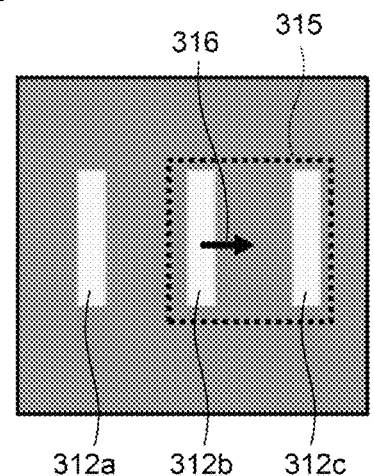

In the matching of the lower layer patterns 302a to d, since the lower layer patterns 302a to d are periodic, a case where the matching position 313 is selected for the lower layer patterns 312a and 312b on the left side of the image as shown in FIG. 24(c), and a case where the matching position 315 is selected for the lower layer patterns 312b and 312c on the right side of the image as shown in FIG. 24(d) can be considered. In FIG. 24 (c), an arrow 314 indicates the offset amount of the lower layer pattern when the matching position 313 is selected, and an arrow 316 indicates the offset amount of the lower layer pattern when the matching position 315 is selected. The arrow 314 indicates that the lower layer pattern is offset to the left, and the arrow 316 indicates that the lower layer pattern is offset to the right.

Figure 24E:
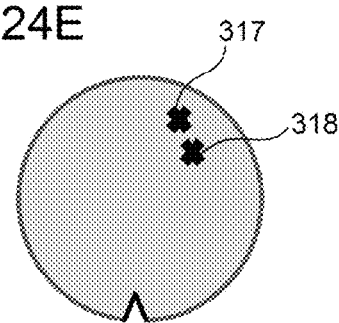

A method for determining the amount and direction of the offset will be described with reference to FIGS. 24 (e) and 24 (f) As shown in FIG. 24(e), when a measurement point 317 is measured on the current wafer 11 and the offset amount and the offset direction at the measurement point 317 are determined, the offset amount at the measurement point 317 can be determined with reference to the offset amount and the offset direction at a measurement point 318 closest to the measurement point 317 where the measurement is completed.

Figure 24F:
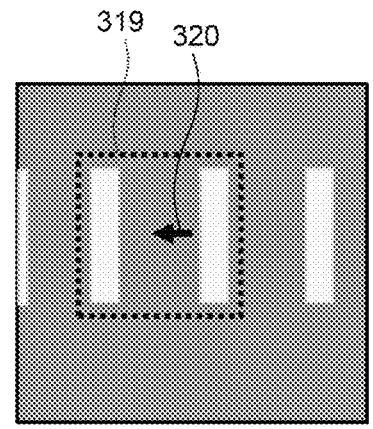

For example, when the second image P2 and a matching position 320 as shown in FIG. 24(f) are obtained at the measurement point 317 and the offset amount and direction as shown in FIG. 24 (c) are obtained at the nearest point 318, with reference to this offset amount and direction, the offset amount and direction at the measurement point 317 can be determined. When a plurality of offset amounts and offset amount candidates are obtained at the measurement point 317, a candidate that approximates the offset amount and direction at the measurement point 318 can be selected as the offset amount and direction at the measurement point 317.

In the fourth embodiment, the specification is such that the result of the measurement point closest to the current measurement point is referred to, but an approximate expression from the results of a plurality of measurement points may be used. Further, the specification may be such that the pattern offset amount at each measurement point calculated by template matching is output with the overlay deviation measurement result.

The present invention is not limited to the above-described embodiments, and includes a variety of modification examples. For example, the above-described embodiments have been described in detail for easy understanding of the present invention, and are not necessarily limited to those having all the configurations described above. Further, a part of the configuration of one embodiment can be replaced with the configuration of another embodiment, and the configuration of one embodiment can be added to the configuration of another embodiment. Also, for apart of the configuration of each embodiment, addition, deletion, or replacement of another configuration can be made. Further, each of the above-described configurations, functions, processing units, processing means, and the like may be partially or entirely realized by hardware, for example, by designing an integrated circuit.

REFERENCE SIGNS LIST

1: column
2: sample chamber
3: electron gun
4: condenser lens
5: aligner
6: ExB filter
7: deflector
8: objective lens
9: secondary electron detector 10: backscattered electron detector
11: wafer
12: standard sample
13: XY stage
14: optical microscope
15, 16: amplifier
17: electron optical system controller
18: stage controller
19: image processing unit
20: control unit

The invention claimed is:

1. A charged particle beam device comprising:
a charged particle beam irradiation gun that irradiates a sample with a charged particle beam;
a first detector that detects secondary electrons from the sample;
a second detector that detects backscattered electrons from the sample;
at least one processor programmed to generate a first image including an image of a first pattern located on a surface of the sample based on an output of the first detector, and generate a second image including an image of a second pattern located in a lower layer than the surface of the sample based on an output of the second detector; and
wherein the at least one processor is programmed to adjust a position of a measurement area in the first image based on a first template image for the first image, and adjust a position of a measurement area in the second image based on a second template image for the second image.

2. The charged particle beam device according to claim 1, wherein the at least one processor is programmed to calculate the amount of overlay deviation between the first image and the second image in accordance with a result of adjusting the position of the measurement area.

3. The charged particle beam device according to claim 1, wherein the at least one processor is programmed to generate the first template image based on the first image and generate the second template image based on the second image.

4. The charged particle beam device according to claim 3, wherein
the at least one processor generates the second template image for each of a plurality of layers when the second image includes images of the plurality of layers.

5. The charged particle beam device according to claim 4, wherein
the at least one processor is configured to be able to set a mask area in a part of the second image.

6. The charged particle beam device according to claim 3, wherein
the at least one processor is configured to set a plurality of template areas for one image included in the second image, and to be able to generate the second template image based on the plurality of template areas.

7. The charged particle beam device according to claim 3, wherein
the at least one processor is configured to employ one of a plurality of second template images according to a matching rate with the second image when generating the plurality of second template images for the second image.

8. The charged particle beam device according to claim 1, wherein
when adjusting the position of the measurement area at one measurement point, the at least one processor determines an offset amount and an offset direction at the one measurement point according to the offset amount and the offset direction obtained at a measurement point in the vicinity where the measurement is completed.

9. A charged particle beam device comprising:
a charged particle beam irradiation gun that irradiates a sample with a charged particle beam;
a first detector that detects secondary electrons from the sample;
a second detector that detects backscattered electrons from the sample;
at least one processor programmed to generate a first image including an image of a first pattern located on a surface of the sample based on an output of the first detector, and generate a second image including an image of a second pattern located in a lower layer than the surface of the sample based on an output of the second detector; and
wherein the at least one processor is programmed to adjust a position of a measurement area in the first image and adjusts a position of a measurement area in the second image, wherein
when adjusting the position of the measurement area at one measurement point, the at least one processor determines an offset amount and an offset direction at the one measurement point according to the offset amount and the offset direction obtained at a measurement point in the vicinity where the measurement is completed.

* * * * *